United States Patent [19]
Yamazaki et al.

[11] Patent Number: 5,821,563
[45] Date of Patent: Oct. 13, 1998

[54] SEMICONDUCTOR DEVICE FREE FROM REVERSE LEAKAGE AND THROW LEAKAGE

[75] Inventors: Shunpei Yamazaki, Tokyo; Yasuhiko Takemura, Kanagawa, both of Japan

[73] Assignee: Semiconductor Energy Laboratory Co., Ltd., Atsugi, Japan

[21] Appl. No.: 213,837

[22] Filed: Mar. 16, 1994

Related U.S. Application Data

[63] Continuation of Ser. No. 813,071, Dec. 26, 1991, abandoned.

[30] Foreign Application Priority Data

| Dec. 25, 1990 | [JP] | Japan | 2-418364 |
| Dec. 25, 1990 | [JP] | Japan | 2-418365 |
| Jan. 19, 1991 | [JP] | Japan | 3-019538 |
| Jan. 21, 1991 | [JP] | Japan | 3-020508 |
| Feb. 22, 1991 | [JP] | Japan | 3-050792 |

[51] Int. Cl.$^6$ .................................................. H01L 29/76
[52] U.S. Cl. ........................... 257/66; 257/57; 257/59; 257/344; 257/408
[58] Field of Search ...................... 357/23.7; 257/61, 257/77, 371, 408, 336, 346, 367, 344, 369, 55, 57, 63, 65, 66, 345, 347, 349, 59

[56] References Cited

U.S. PATENT DOCUMENTS

| 4,755,805 | 7/1988 | Wilson et al. | 357/63 |
| 4,772,927 | 9/1988 | Saito et al. | 357/23.7 |
| 4,862,240 | 8/1989 | Watanabe et al. | 357/42 |
| 4,899,202 | 2/1990 | Blake et al. | 257/336 |
| 4,916,508 | 4/1990 | Tsukamoto et al. | 357/59 |
| 4,959,700 | 9/1990 | Yamazaki | 357/23.7 |
| 4,994,413 | 2/1991 | Eshita | 437/244 |
| 5,060,036 | 10/1991 | Choi | 357/23.7 |
| 5,235,204 | 8/1993 | Tsai | 257/408 |
| 5,315,132 | 5/1994 | Yamazaki | 257/66 |

FOREIGN PATENT DOCUMENTS

| 494694 | 1/1992 | European Pat. Off. | 257/59 |
| 52-14382 | 3/1977 | Japan | 257/346 |
| 59-103381 | 6/1984 | Japan | 257/345 |
| 61-100967 | 5/1986 | Japan | 257/66 |
| 1289169 | 11/1989 | Japan | 257/66 |

*Primary Examiner*—Mahshid D. Saadat
*Assistant Examiner*—T. M. Arroyo
*Attorney, Agent, or Firm*—Sixbey, Friedman, Leedom & Ferguson, P.C.; Gerald J. Ferguson, Jr.; Eric J. Robinson

[57] ABSTRACT

A semiconductor device and a method for forming the same are disclosed. The semiconductor device comprising an insulated gate field effect transistor provided with a region having added thereto an element at least one selected from the group consisting of carbon, nitrogen, and oxygen, said region having established at either or both of the vicinity of the boundary between the drain and the semiconductor layer under the gate electrode and the vicinity of the boundary between the source and the semiconductor layer under the gate electrode for example by ion implantation using a mask. It is free from the problems of reverse leakage between the source and the drain, and of throw leakage which occurs even at a voltage below the threshold ascribed to the low voltage resistance between the source and the drain.

9 Claims, 27 Drawing Sheets

F I G. 7
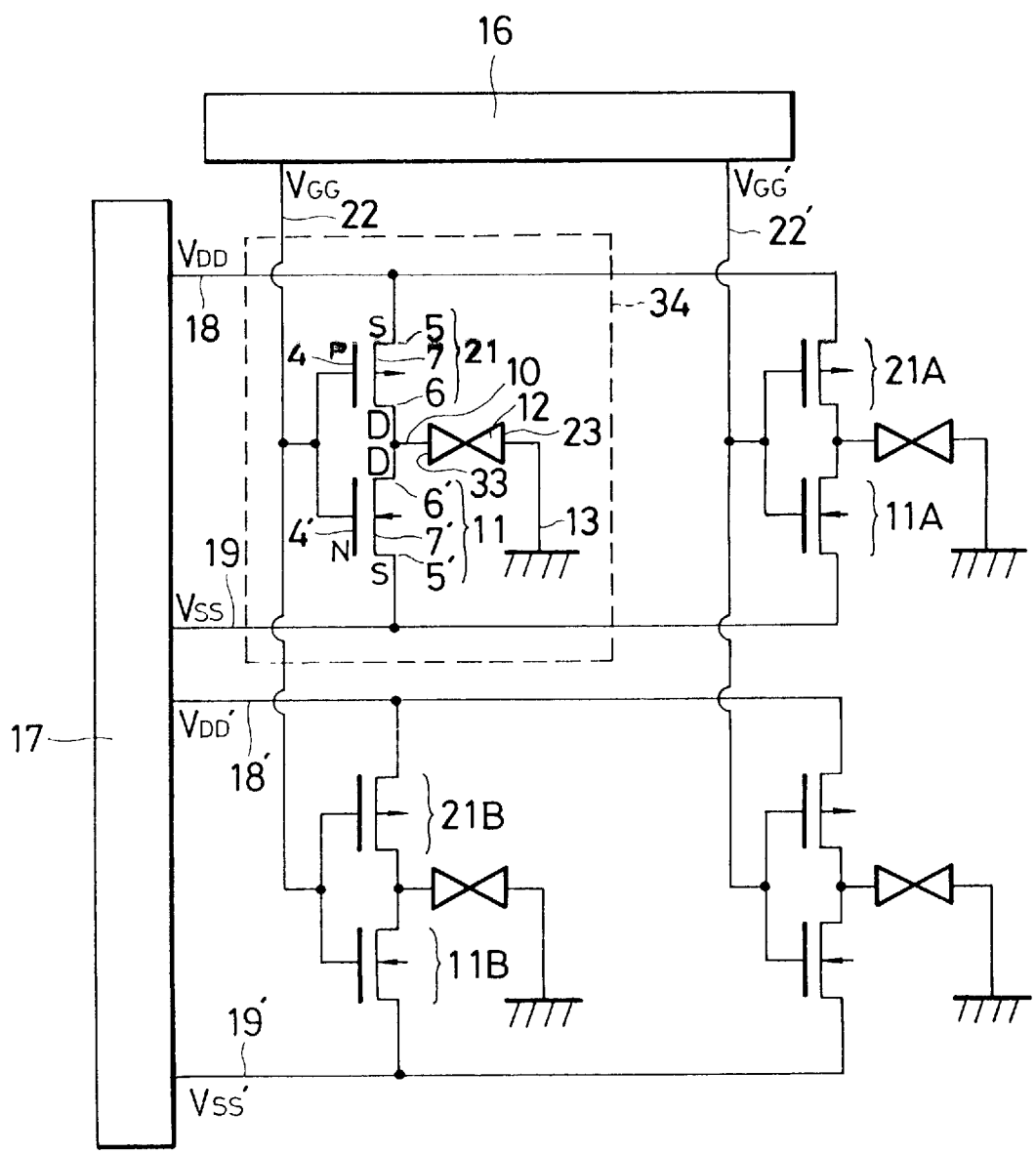

F I G . 10
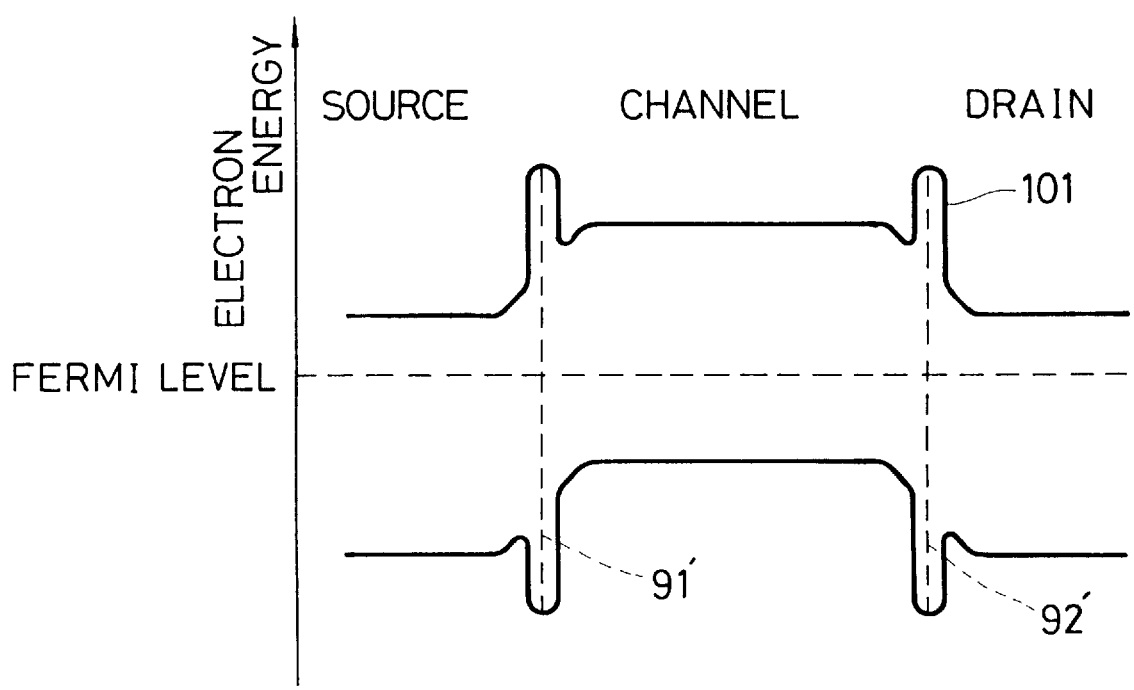

F I G.12
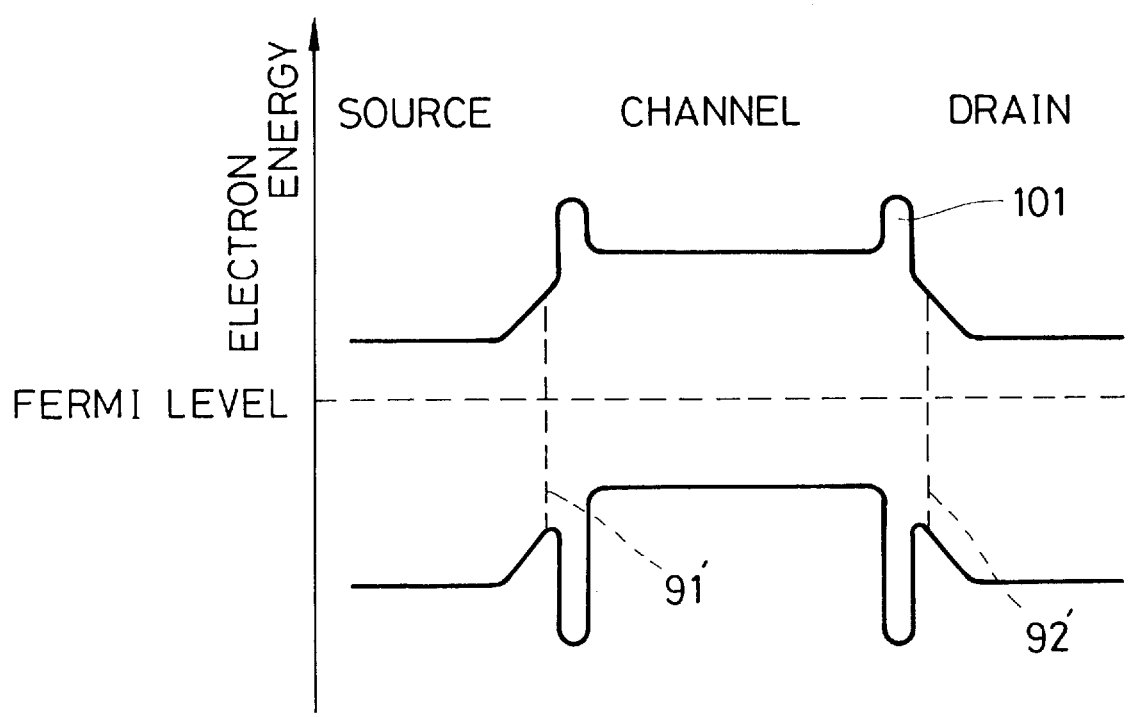

SEMICONDUCTOR DEVICE FREE FROM REVERSE LEAKAGE AND THROW LEAKAGE

This application is a Continuation of Ser. No. 07/813,071, filed Dec. 26, 1991, now abandoned.

BACKGROUND OF THE INVENTION

1. Field of the Invention

The present invention relates to an insulated gate field effect semiconductor device (FET) for use in switching devices, integrated circuits (ICs), and display devices such as liquid crystal displays and the like.

2. Description of the Prior Art

Insulated gate FETs heretofore fabricated unexceptionally comprise a semiconductor region in which a source, a channel, and a drain are established. In such insulated gate FETs, the drain is in contact with the channel and the source is in contact with the channel. However, in those types of insulated gate FETs, there have occurred problems such as the reverse current leakage from the drain to the source, and the poor drain voltage resistance.

More specifically, as is illustrated in FIG. 2, an insulated gate FET of the type above often suffers problems ascribed to the reverse current leakage. That is, the current which flows reversely from the drain to the source yields a curve indicated with (B) in the FIGURE; typically, although the gate voltage $V_G$—drain current $I_D$ relation should result in a curve indicated with (A).

This phenomenon is ascribed to the occurrence of a punch-through current. That is, even in a gate voltage at which normally no channel forms, i.e., at a condition well below the threshold voltage $V_{th}$, an abrupt increase of the drain current occurs It the voltage applied between the source and the drain surpasses a certain value. The generation of this punch-through current is explained by the influence of the reverse bias at the drain junction which also affects the source junction. Since this punch-through current flows between the source and the drain along a path relatively deep with respect to the channel surface, it is possible to cut off the punch-through current by increasing impurity concentration along this path and thereby setting a high resistance between the source and the drain.

The low drain voltage resistance also impairs the output characteristics, as is illustrated in FIG. 3 by the curve (B) which shows the drain current $I_D$ against the drain voltage $V_D$. At a voltage below the threshold, typically, the $I_D$-$V_D$ curve should have a sharp rise as is shown in FIG. 3, curve (A). The low drain voltage resistance is also ascribed to the punch-through current as explained hereinbefore. If an insulated gate FET having a $V_D$-$I_D$ curve (B) in FIG. 3 were to be fabricated, a drain current will flow continuously to result in a throw leakage state even though a voltage well below the threshold voltage were to be applied to the gate electrode. This would result in a switching device having poor reliability and insufficient performance.

As a means to overcome the problem of punch-through current attributed to the low drain voltage resistance, i.e., the poor insulation between the source and the drain, there is proposed, as is shown in FIG. 4, to provide a semiconductor layer having added therein hydrogen as an offset gate 49. Referring to FIG. 4, there is provided an insulated gate FET comprising a quartz substrate 41, a thin film of polycrystalline silicon 42, a silicon oxide film 43, a polycrystalline silicon electrode 44, a source 45, a drain 46, aluminum electrodes 47, and an offset gate 49. The offset gate prevents the electric field from concentrating in this portion. There is proposed another measure which comprises establishing, to the same area as that of the offset gate, a drain having lightly doped with an impurity which imparts one conductivity type thereto. This process, which is known as a light-dope drain (LDD) process, also relaxes concentration of the electric field in the boundary between the channel and the gate or between the channel and the source. In this process, however, the impurity having doped for imparting one conductivity type to a part of the semiconductor layer diffuses from the drain and the source that there still remains a problem to be solved.

This is because the impurity for imparting one conductivity type to the semiconductor layer is the one that is easily diffused by heat. For an insulated gate field effect transistor in which the channel length is not longer than sub-microns, this becomes a major problem. That is, there is a problem that a current flow is continuously formed between the source and the drain in the channel forming region due to diffusion of impurities from the source and the drain to the channel forming region.

SUMMARY OF THE INVENTION

An object of the present invention is to provide a semiconductor device comprising an insulated gate FET free from problems such as the leakage of reverse current from the drain to the source, and the low drain voltage resistance, which both had been the problems of the prior art insulated gate FETs.

This and other objects of the present invention have been attained by a semiconductor device comprising an insulated gate FET provided with a region having added thereto an element at least one selected from the group consisting of carbon, nitrogen, and oxygen, said region having established at either or both of the vicinity of the boundary between the drain and the semiconductor layer under the gate electrode and the vicinity of the boundary between the source and the semiconductor layer under the gate electrode.

The present invention relates also to a method for fabricating a semiconductor device comprising an insulated gate field effect transistor in which a region having added thereto at least one element selected from the group consisting of carbon, nitrogen, and oxygen is provided in the vicinity of at least one of the boundary between the source region and the semiconductor layer located below the gate electrode and the boundary between the drain region and the semiconductor located below the gate electrode, said method comprising: carrying out simultaneously with the patterning of the gate electrode on a gate insulator on a semiconductor layer, perforation of an opening through which at least one of the elements selected from the group consisting of carbon, nitrogen, and oxygen is added to the semiconductor layer; adding at least one of the elements selected from the group consisting of carbon, nitrogen, and oxygen; and completing the gate electrode thereafter to thereby provide an area having added therein at least one of the elements selected from the group consisting of carbon, nitrogen, and oxygen, to the outer side of the semiconductor layer under the gate electrode or to the boundary between the semiconductor layer under the gate electrode and the source and/or the drain.

The present invention further relates to a process for fabricating a semiconductor chip comprising a substrate having provided thereon a semiconductor device, which comprises: forming a mask pattern having an opening therein and made of a resist, an insulator, a metal, a semiconductor or a composite thereof and provided on a semiconductor layer; and then adding at least one of the elements selected from the group consisting of carbon, nitrogen, and oxygen to the semiconductor layer through the opening. The process for fabricating a semiconductor device according to the present invention enables an insulated gate FET characterized by that it is provided with a region having added thereto an element at least one selected from the group consisting of carbon, nitrogen, and oxygen, said region having established at either or both of the vicinity of the boundary between the drain and the semiconductor layer under the gate electrode and the vicinity of the boundary between the source and the semiconductor layer under the gate electrode.

The 'vicinity of the boundary' as referred herein signifies a vicinity of a mechanical joint between semiconductors having different characteristics (properties), such as the area at which an I semiconductor is brought in contact with an N semiconductor, or such at which a P semiconductor is contacted with an N semiconductor; otherwise, it signifies an electrical joint between semiconductors having different characteristics. The electrical joint means a joint portion through which an electric interaction is conducted under the strongest electric field, or a joint which is defined as an electronic phenomena attributed to the difference in concentration or in type of impurities present.

Referring to FIG. 1, an N-channel thin film transistor (TFT) according to an embodiment of the insulated gate FET of the present invention is explained. The N-channel TFT comprises a glass substrate 1, a silicon oxide underlayer 38, a source 5', a drain 6', a channel 7', an $SiO_2$ gate oxide film 3', a gate electrode 4, an insulator 8, a source electrode 8', and a drain electrode 8". A region A' having added thereto carbon is provided to the boundary between the source 5' and a semiconductor layer 7' (a channel forming region in this case) below the gate electrode, and similarly, a region B' having added thereto carbon is also provided to the boundary between the drain 6' and a semiconductor layer 7' below the gate electrode. The above fabrication process also comprises a step of doping phosphorus, an impurity for imparting the N type conductivity, by ion implantation using the gate electrode 4 as a mask, to thereby establish a source region 5' and a drain region 6', both of the N type conductivity. Therefore, the regions having added thereto carbon are provided to the boundary 111 between the source region 5' and the channel region and to the boundary 112 between the drain region 6' and the channel region, respectively.

The insulated gate FET in accordance with the present invention, as shown in FIG. 17 for example, is formed on a semiconductor substrate 301 and composed of field insulating films 302 and 303, a gate electrode 304, a source region 305, a drain region 306, a source electrode 307, a drain electrode 308, regions 309 and 310 having added thereto at least one element selected from the group consisting of carbon, nitrogen, and oxygen (referred to as FDD (foreign element doped drain) hereinafter) located contiguously to said source and drain regions, and an interlayer insulating layer 311. Specifically, the regions having added thereto oxygen is called 'oxygen doped drain' (ODD), instead of FDD. In the structure shown in FIG. 17, carbon has been added to the FDD regions 309 and 310 and the channel forming region is formed in the semiconductor layer (substrate) under the gate electrode. In the fabrication process of this structure, phosphorus, the impurity for imparting the N type conductivity, is doped into the semiconductor substrate by ion implantation using the gate electrode 304 as a mask to thereby establish source and drain regions 5' and 6'. Accordingly, the source and drain regions 305 and 308 extend to the boundaries 312 and 313 between the FDD regions and the channel forming region, that is, strictly speaking, the regions 309 and 310 having added thereto carbon are provided in the drain 306 and the source 305.

An energy band for such an N channel TFT is as schematically illustrated in FIG. 5. In the case of the structure as explained above and as shown in FIG. 1, regions 52 of the large band gap in FIG. 5 are provided on the sides of the source and the drain of depletion layers, due to the addition of carbon. With such a band structure illustrated in FIG. 5, a reverse current leakage from the drain region 51 to the channel 53 would not occur, since a carrier 54, for example, cannot migrate to the channel 53 due to the large band gap of the region 52 having added thereto at least one element selected from the group consisting of carbon, nitrogen, and oxygen (carbon in this case). Thus, even if a negative voltage were to be applied to the gate electrode, no reverse current leakage as shown schematically with curve (B) in FIG. 2 occurs but an ideal gate voltage ($V_G$)—drain current ($I_D$) curve as exemplified by curve (A) in FIG. 2 can be obtained. Furthermore, it is possible to elevate the drain voltage resistance since a potential barrier can be established by increasing the band gap at the region 52 having added thereto at least one element selected from the group consisting of carbon, nitrogen, and oxygen. As a result, a conventional gate current ($I_G$)—drain voltage ($V_D$) relation as shown by curve (E) in FIG. 3 which resulted from the throw current leakage due to the punch through current can be modified to the relation as shown by curve (A). Further with the composition or the present invention, the impurity such as carbon, nitrogen, and oxygen combines with and neutralize dangling bonds present within carrier generating regions (i.e. within the vicinities of the boundaries 111 and 112, in this case) and thereby the density of recombination centers is descended, so that the characteristic of the device can be improved accordingly. The width of the band gap of the region 52 is controlled by changing the lateral width of the region having added thereto carbon (namely, in the direction parallel to the source—channel—drain line), and also the height thereof is controlled by changing the concentration of carbon to add thereto. Accordingly, it can be seen that the present invention has been constructed based on a technological concept well distinguished from the above-mentioned LDD process of relaxing the electric field concentration.

The insulated gate FET according to the present invention comprises a region having added therein at least one of carbon, nitrogen, and oxygen, at the boundary between the source and the semiconductor under the gate electrode or at the boundary between the drain and the semiconductor under the gate electrode. The region (e.g., the portion 52 in FIG. 5) has a wider energy band gap as compared with the source, drain, and channels. If there is used silicon as the semiconductor, for instance, this region can be obtained as silicon carbide, silicon nitride, or silicon oxide, by adding the aforementioned carbon, nitrogen, or oxygen to the boundary. Silicon carbide expressed by $Si_XC_{1-X}$ ($0 \leq X < 1$), silicon nitride expressed by $Si_3N_{4-X}$ ($0 \leq X < 4$), or silicon oxide expressed by $SiO_{2-X}$ ($0 \leq X < 2$) can be used in the structure according to the present invention.

In a prior art device, the use of a polycrystalline silicon greatly impairs the device stability since the impurity having doped to impart the p- or n-type conductivity to the semiconductor layer would drift to the channels through the grain boundaries (GBs). Thus, the addition of an impurity at a high concentration to the source or to the drain with an intention to impart either p- or n-type conductivity and thereby obtain a high conductivity, reversely affected the stability of the device performance. In the device structure according to the present invention, however, the region having added thereto carbon, nitrogen, or oxygen functions as a blocking layer that there is no drift of the impurities having doped with the purpose of establishing one conductivity type from the drain and the source to the channel.

Even it an impurity of Group V of the Periodic Table such as phosphorus in the case of an N channel TFT, or an impurity of Group III of the Periodic Table such as boron in the case of a P channel TFT is added to the source and drain regions at a concentration higher than that in the conventional process, the impurity is prevented, by the blocking regions, from drifting into the channel during a thermal annealing step. As a result, source and drain regions having the conductivity $\sigma$ of $10^{-1}$ to $10^3$ $(\Omega cm)^{-1}$ can be obtained.

The insulated gate FET according to the Present invention is characterized by that a region having added carbon, nitrogen, or oxygen to realize a wide band gap is established at the area to which an electric field concentrates, e.g., at the vicinity of the boundary between the channel and the drain, to obtain a high band gap which is capable of avoiding leakage of the carriers. It can be thus seen clearly that the present invention is based on a concept completely different from the conventional concept based an the relaxation of the electric field concentration.

Also, the location of the large band gap can be shifted depending on the location of the region to add thereto the impurity such as carbon, nitrogen, and oxygen.

Further, the present invention has a feature that the location of the wide band gap can be shifted by changing the location of the region adding thereto the impurity such as carbon, nitrogen, and oxygen. Of course, the resistance becomes large in the region to establish a wide band gap, resulting in the relaxation of electric field concentration.

It is needless to say that combining the present invention with the known LDD structure, and further combining the above structure with the SDD (side doped drain) structure in which a channel forming region is formed in trapezoid shape protrusion of a substrate makes it possible to further improve the device characteristic.

In the structure shown in FIG. 17, the impurity for activating the semiconductor is doped, extending to the boundaries 312 and 313. However, when the impurity is doped within the source region and drain region 305 and 306 only and a very small amount of oxygen (at $10^{18}$ to $10^{21}$ atoms per 1cm$^3$) is doped to the ODD regions 309 and 310, these oxygen atoms become donors in the semiconductor such as silicon and impart the weak N type conductivity to the semiconductor, so that in the case of NMOS in which the source and drain regions have the N type conductivity it is possible to make it seemingly have a LDD structure. Further, since oxygen atoms themselves hardly diffuse in a semiconductor compared with the usual impurity element such as phosphorus, boron, and arsenide, the problem caused in the conventional LDD structure can be prevented, i.e. the problem that the channel region is contaminated due to the diffusion of the impurity element from the source and drain regions including LDD regions and a current flow is continuously formed between the source and the drain in the channel. This process makes it possible to elevate the productivity of the insulated gate FET having a channel length not longer than sub-microns, specifically not longer than quarter-microns. In the above case of doping a very small amount of oxygen too, the punch through current can be prevented by providing the ODD regions 309 and 310 in the portions deeper than the locations of the source region 305 and the drain region 306.

Needless to say, the semiconductor device in accordance with the present invention is not limited to the insulated gate FET, but the present invention is applicable as a means to solve the problem resulting from the local concentration of electric field (the problem of throw leakage, for example).

Naturally, the structure according to the present invention can be applied to any type of the insulated gate FETs such as those of a stagger type, an inverted stagger type, a planar type, and an inverted planar type, to improve voltage resistance between the source and the drain and to avoid the occurrence or a punch-through current. The device according to the present invention not only is applicable to an insulated gate FET, but also is applicable to various other semiconductor devices and is effective to overcome problems (such as the problem of throw leakage) which originate from a local concentration of the electric field.

BRIEF DESCRIPTION OF THE DRAWINGS

FIG. 7 is a schematic view of the structure of a device according to an embodiment of the present invention;

FIG. 10 is a schematic representation of an energy band for the structure according to the present invention;

FIG. 12 is a schematic representation of an energy band for the structure according to the present invention;

DETAILED DESCRIPTION OF THE PRESENT INVENTION

The present invention is described in further detail below referring to non-limiting examples.

EXAMPLE 1

This example provides a method for fabricating a semiconductor device on a substrate. According to the method, the patterning to form a gate electrode on a gate insulating film and the formation of an opening for adding therethrough at least one element selected from the group consisting of carbon, nitrogen, and oxygen are carried out at the same time. Then, the above element is added through the opening and the gate electrode is completed. By the above procedure, the region having added thereto at least one element selected from the group consisting of carbon, nitrogen, and oxygen is provided in the periphery of the semiconductor layer below the gate electrode, or between the semiconductor layer below the gate electrode and the source and drain.

Figure 6:
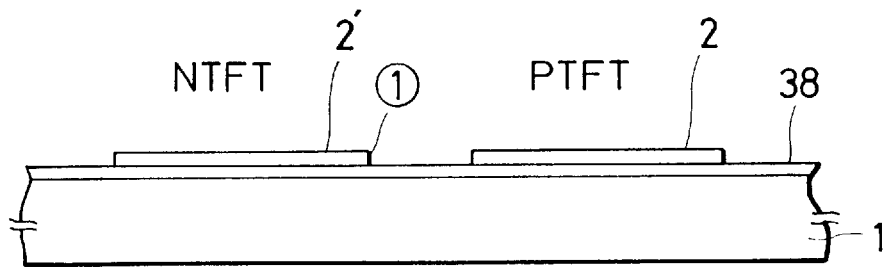
FIG. 6 is a schematic representation illustrating a fabrication process of an insulated gate FET according to an embodiment of the present invention.
Figure 6:
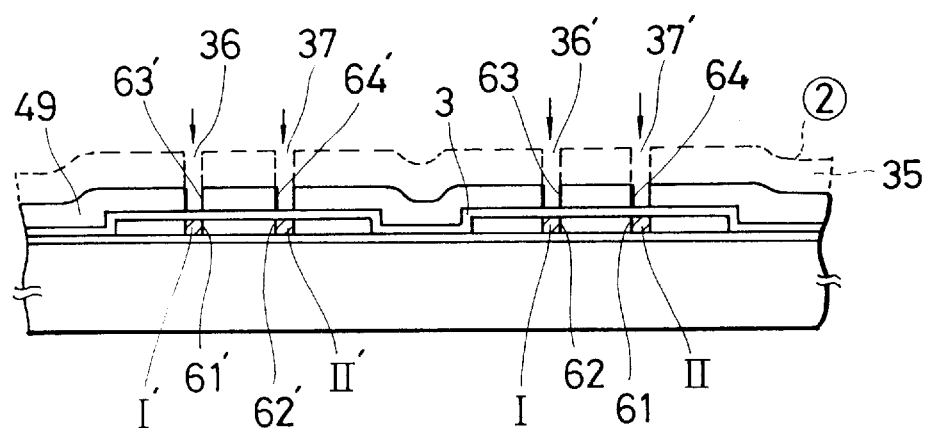
Figure 6:
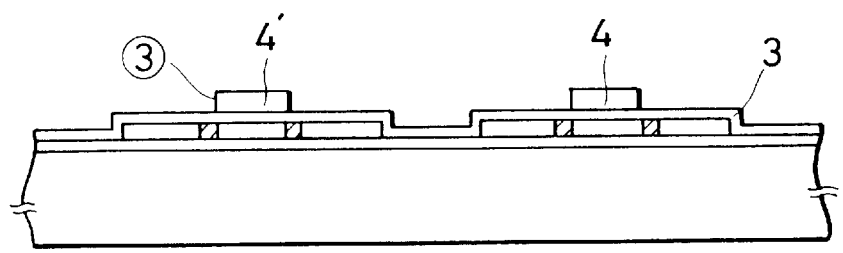
Figure 6:
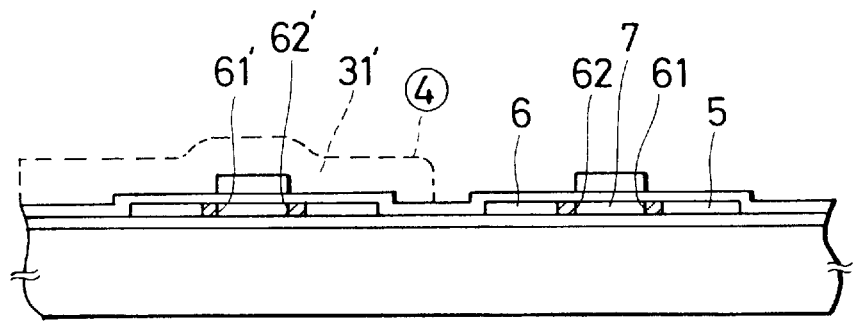
Figure 6:
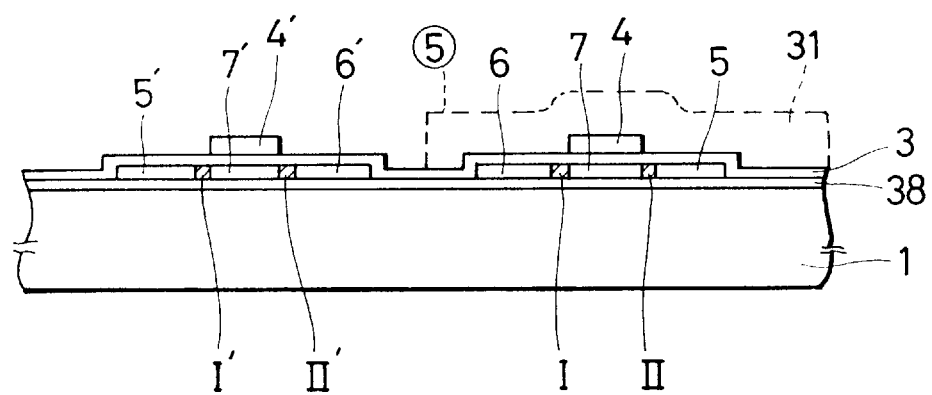
Figure 6:
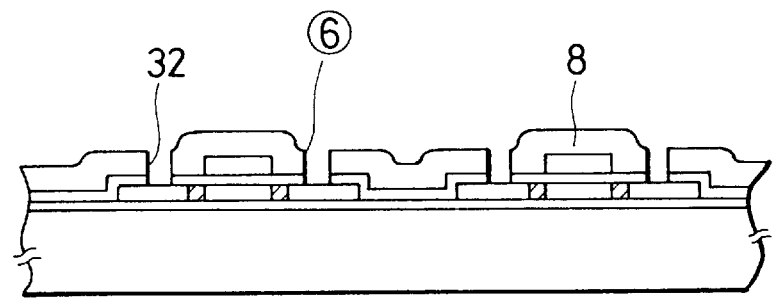
Figure 6:
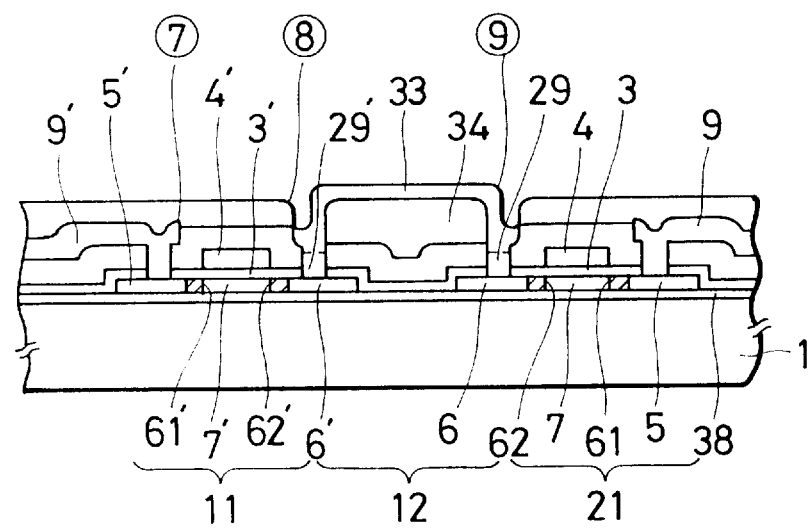

Referring to FIG. 6, a process for fabricating a complementary TFT (C/TFT) pair is described. The C/TFT pair comprises an n-channel TFT and a p-channel TFT provided on a glass substrate at a complementary structure. The symbols or abbreviations used for the explanation in EXAMPLE 1 are common throughout the descriptions below.

The C/TFT pair according to an embodiment of the present invention is a device having a complementary structure constructed from a p-channel FET 21 in FIG. 7 and an n-channel FET 11 shown also in FIG. 7. FIG. 7 illustrates a case in which the C/TFT pair is used as the pixel driver of a liquid crystal display device. In FIG. 7, the display comprises a 2×2 matrix accompanied by peripheral circuits 16 and 17. A single pixel 34 in this matrix connects the gates of the p-TFT and n-TFT, and is further connected to a line $V_{GG}$ 22 or $V_{GG}$, 22' of the Y-axis direction. Further, the common output from C/TFT pair is connected to a liquid crystal 12. An inlet (Vss side) of the p-TFT is connected to lines $V_{DD}$ 18 and $V_{DD}$ 18' of the X-axis direction, and an inlet (Vss side) of the n-TFT is connected to a line Vss 19.

In such a configuration, the liquid crystal potential 10 ($V_{LC}$) becomes 0 when $V_{DD}$ 18 and $V_{GG}$ 22 give "1". If $V_{DD}$ 18 is "1" with $V_{GG}$ 22 being 0, the liquid crystal potential 10 ($V_{LC}$) then becomes "1". That is, $V_{GG}$ and $V_{LC}$ are anti-phase. If the n-TFT and the p-TFT in FIG. 7 are provided in a reversed arrangement, $V_{GG}$ and $V_{LC}$ become in-phase. The peripheral circuit is constructed from a sufficiently small number of TFTs, particularly, C/TFTs free from impurities such as oxygen having doped for the aforementioned purposes. TFTs having a mobility of from 20 to 200 $cm^2/V \cdot sec$ were used to realize quick operation.

Referring now to FIG. 6, the fabrication process to obtain the C/TFT pair as shown in FIG. 7 is described. In FIG. 6, a 1000 to 3000 Å thick silicon oxide film as a blocking layer (undercoat) was deposited by Radio-Frequency (RF) magnetron sputtering on a glass substrate 1 made from a material such as AN glass, Pyrex glass, and the like, which is resistant to a thermal treatment at a temperature of about 600° C. The film deposition was carried out using a single crystal silicon as the target in 100% oxygen atmosphere, at a film deposition temperature of 150° C., an output in the range of from 400 to 800 W, and a pressure of 0.5 Pa.

On the substrate having provided thereon the undercoat was further deposited a silicon film the impurity content of which is controlled, so that the film may contain $7\times10^{19}$ $cm^{-3}$ or less, preferably, $1\times10^{19}$ $cm^{-3}$ or less of oxygen, carbon, or nitrogen in total. The film was deposited by Low Pressure Chemical Vapor Deposition (LPCVD), sputtering, or plasma assisted CVD.

In case of the film deposition by LPCVD, disilane ($Si_2H_6$) or trisilane ($Si_3H_8$) gas was supplied to the CVD apparatus at a temperature range of from 450° to 550° C., i.e., a temperature lower than the crystallization temperature by 100° to 200° C., while controlling the inner pressure of the reaction furnace in the range of from 30 to 300 Pa. The film deposition rate was in the range of from 30 to 100 Å/minute. There may be further added boron during the film deposition at a concentration of from $1\times10^{15}$ to $5\times10^{17}$ $cm^{-3}$ using diborane, to thereby adjust the threshold voltage ($V_{th}$) of n-TFT and p-TFT to be approximately equivalent.

In case of the film deposition by sputtering, the deposition was conducted using single crystal silicon as the target, under a mixed atmosphere comprising argon having mixed therein from 50 to 80% by volume of hydrogen, e.g., under a mixed atmosphere comprising 30% by volume of argon and about 80% by volume of hydrogen. The back pressure before sputtering was controlled to be $1\times10^5$ Pa or lower. The temperature at the film deposition was 150° C., and sputtering was carried out at a frequency of 13.56 MHz and a sputtering output in the range of from 400 to 800 W, with a pressure of 0.5 Pa.

In case of deposition or a silicon film by plasma CVD process, a disilane ($Si_2H_6$) or monosilane ($SiH_4$) gas was supplied to the CVD apparatus at a temperature of, e.g., 300° C., and a high frequency power at 13.58 MHz was applied thereto.

Then, as shown in FIG. 6(A), semiconductor film was removed while leaving out the predetermined area 2 and 2', using a first photomask <1>. On the remaining semiconductor film portions 2 and 2' was deposited a silicon oxide film 3 at a thickness in the range of from 500 to 2,000 Å, at a thickness of 1,000 Å for example, under the same conditions as used for the deposition of the undercoat silicon oxide film 38.

In the present example, since the pair of the impurity regions which becomes the source and drain had an extremely low consent of impurities such as oxygen, the crystallization proceeded more effectively. A part of the impurity regions was provided at later steps at the vicinity of the source and drain. Though preferred ideally is to completely confine the impurity region to the source and drain, it was taken into account the practical problems at the process steps and was concluded as to provide impurity regions at a depth up to 5 $\mu$m along the horizontal direction with respect to the source and drain.

After the deposition of the amorphous silicon film at a thickness of from 500 to 10,000 Å (1 $\mu$m), at a thickness of 2,000 Å for example, the amorphous silicon film was subjected to heat treatment for a duration of from 12 to 70 hours in a nonoxidizing atmosphere, in a moderate temperature range of from 500° to 750° C. in which crystal growth would not take place. More specifically, the thermal annealing was carried out at 600° C. in a nitrogen or hydrogen atmosphere.

Since an amorphous silicon oxide film is deposited on the surface of the underlying substrate, the whole semiconductor film can be uniformly annealed free from the development of a particular crystal nucleus. That is, the as-deposited film has an amorphous structure and coexists with the hydrogen molecules as a simple mixture. After annealing, the semiconductor film at the channel forming region transforms to a state of higher ordering, with a part thereof attaining a crystalline structure. At the film deposition of silicon, in particular, the region having a relatively high ordering tend to crystallize and achieve a crystalline state. However, since the bonding is established by silicon atoms present between those regions, those silicon atoms strongly attract each other. This fact can be observed by laser Raman spectroscopy, since the silicon film yields a spectrum having a band peak assigned to the (111) plane of the crystal being shifted to a lower frequency side as compared with that of the single crystal silicon which yields the peak at 522 cm$^{-1}$. The apparent crystallite size as calculated from the half-band with is in the range of a microcrystal, i.e., in the range of from 50 to 500 Å, but in fact, the highly crystalline portions are present as many clusters in the film, and the clusters are connected with each other by the anchoring between the silicon atoms to give a semi-amorphous structure. According to the analysis by secondary-ion mass spectroscopy (SIMS) to obtain the depth profile of the impurity (additive) distribution, the minimum concentration obtained either at the surface or a position other than the surface (inner position) was $3\times10^{19}$ cm$^{-3}$ for oxygen and $4\times10^{17}$ cm$^{-3}$ for nitrogen. The hydrogen concentration was $4\times10^{20}$ cm$^{-3}$, which accounts for 1 atomic % with respect to the concentration of silicon which is $4\times10^{22}$ cm$^{-3}$. The crystallization can be effected by thermal annealing at 600° C. for 49 hours, for example, for a film 1000 Å in thickness and containing oxygen at a concentration of $1.5\times10^{20}$ cm$^{-3}$. However, with increasing oxygen concentration to $5\times10^{20}$ cm$^{-3}$, the annealing became barely effective at 600° C. by increasing also the film thickness to the range of from 0.3 to 0.5 $\mu$m, but with a thickness of 0.1 $\mu$m, a higher annealing temperature of 650° C. was requisite. In short, thermal annealing could be more readily carried out by increasing the film thickness or by reducing the impurity concentration such as the content of oxygen. As a result, a film substantially free from grain boundaries (GBs) can be obtained. Since the carriers move freely between the clusters through the anchoring of the silicon atoms, a higher carrier mobility can be achieved with this film as compared with the conventional polycrystalline silicon films comprising a clear GB. More specifically, a hole mobility, $\mu$h, in the range of from 10 to 50 cm$^2$/V·sec and an electron mobility, $\mu$e, in the range of from 15 to 100 cm$^2$/V·sec were obtained.

On the other hand, if an annealing at a higher temperature in the range of from 900° to 1200° C. were applied to the deposited film instead of annealing at a moderate temperature, a solid phase growth from the nuclei would be enhanced to cause segregation of the impurities such as oxygen in the film. The resulting polycrystalline film may have a higher mobility within a single crystal, however, the impurities such as oxygen, carbon, and nitrogen concentrates at the GB to develop a barrier therein and hence interfere the movement of the carriers. These are what happen to the conventional polycrystalline films. Thus, conventional films could achieve a low mobility of 5 cm$^2$/V·sec at best, and were subject to a drop in resistant voltage due to the drain leakage at the GB and the like.

As described in the foregoing, a silicon semiconductor having a semi-amorphous or a semi-crystalline structure comprising partially crystallized domains is used in the embodiment according to the device of the present invention. The device described above may comprise a gate oxide film 3 having deposited with a small addition of fluorine. To further ameliorate boundary characteristics and to decrease the density of states between the silicon oxide film and the underlying semiconductor film, oxidation using ozone while irradiating an ultraviolet light was found to be effective. More specifically, to reduce the density of states at the boundary, it was found effective to carry out a photochemical vapor deposition simultaneously with sputtering under the conditions used for the deposition of the blocking layer 38.

Then, a silicon film containing phosphorus at a concentration of from $1\times10^{20}$ to $5\times10^{20}$ cm$^{-3}$, or a multilayer film 49 comprising a silicon film having provided thereon molybdenum (Mo), tungsten (W), MoSi$_2$, or WSi$_2$, was deposited on the surface of the previously deposited silicon oxide film.

Aluminum and other metallic compounds, or general metallic compounds may be used for the multi-layered film 49 so long as the deposition thereof is carried out at a temperature not higher than 700° C. as in this embodiment.

On the multilayer film 49 was then provided a photoresist 35, and by using a second photomask <2>, the resist 35 was preferentially removed. The resist 35 was then used as a mask to partially remove the multilayer film 49 as shown in FIG. 6(B). Then, to the regions 36, 36', 37, and 37' thus obtained by partially stripping off the resist 35 and the multilayer 49 was added carbon, nitrogen, or oxygen, by ion implantation. For example, oxygen was added to give a concentration in the range of from $1\times10^{20}$ to $5\times10^{21}$ cm$^{-3}$, to provide a silicon oxide region having a composition expressed by SiO$_{2-X}$ ($0\leq X \leq 2$). This structure is advantageous in that the gate electrode, the channels, and the impurity regions having added therein carbon, nitrogen, or oxygen can maintain the same spatial relation without taking any special means for the alignment.

According to the SIMS analysis, the impurity concentration was the lowest at the center of the film and the highest at the both ends along the thickness direction. It is preferred that the impurity concentration at the center of the film is $8\times10^{18}$ cm$^{-3}$ or higher, more preferably, $1\times10^{19}$ cm$^{-3}$ or higher.

The ion implantation was carried out under an applied voltage in the range of from 30 to 50 KeV, for example, at 35 KeV. Thus were obtained regions (I), (II), (I'), and (II')

having doped with carbon, nitrogen, or oxygen, as shown in FIG. 6(B). The regions are provided at a width along the horizontal direction in the range of from 0.1 to 30 μm, preferably from 1 to 10 μm, and as an example, 2 μm. The thickness is in the range of from 200 Å to 2 μm, preferably in the range of from 500 Å to 2,000 Å. The thickness in the example was 1,000 Å.

The resulting structure was subjected to patterning using a third photomask <3>. Thus was obtained a structure as shown in FIG. 6(C) by establishing a gate electrode 4 for p-TFT and a gate electrode 4' for n-TFT. In this embodiment, a part of the multi-layered film 48 having partially removed was used for gate electrodes, as shown in FIG. 6(B). Hence, the boundaries 61, 62, 61' and 62' of the regions having added thereto oxygen correspond with 64, 63, 64' and 63', the both ends of the gate electrodes, respectively.

Then, a photoresist 31' was provided using photomask <4> as shown in FIG. 6(D), and boron was added by ion implantation at a dose in the range of from $1\times10^{15}$ cm$^{-2}$ to $2\times10^{15}$ cm$^{-2}$ to the area which will become a source 5 and a drain 6 for the p-TFT. To the resulting structure was further provided a photoresist 31 using a photomask <5>, as shown in FIG. 6(E). Similarly to the step above, phosphorus was added by ion implantation at a dose of $1\times10^{15}$ cm$^{-2}$ to the area which will become a source 5' and a drain 6' for the n-TFT. The doping was carried out through the gate insulator film 3. Alternatively, the silicon oxide on the silicon film in FIG. 6(C) may be removed using the gate electrodes 4 and 4' as the masks, and than boron as well as phosphorus may be directly ion-implanted to the silicon film.

Figure 1:
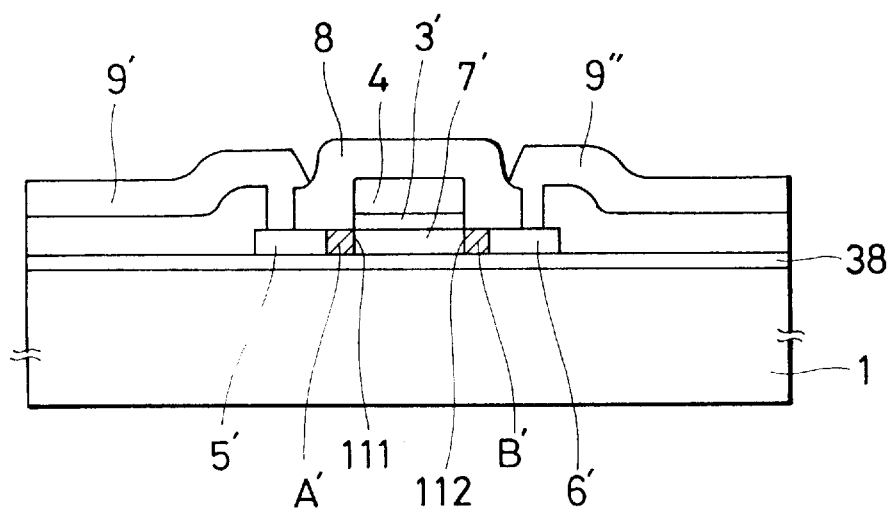
FIG. 1 is a schematic view illustrating an insulated gate FET according to an embodiment of the present invention.
Figure 2:
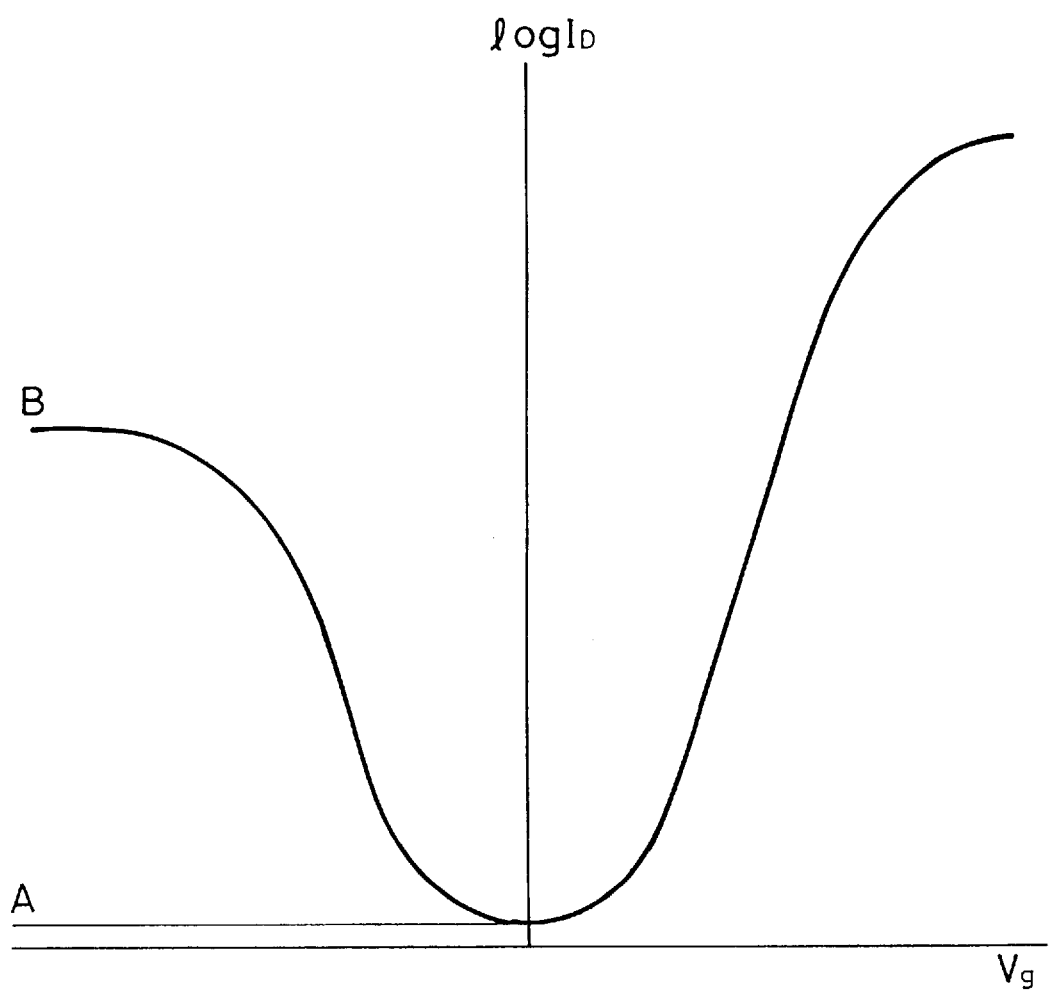
FIG. 2 is a graph showing a gate voltage ($V_G$)—drain current ($I_D$) relation obtained on a structure according to an embodiment or the present invention; there is also shown a $V_G$-$I_D$ relation for a device having a conventional structure.
Figure 3:
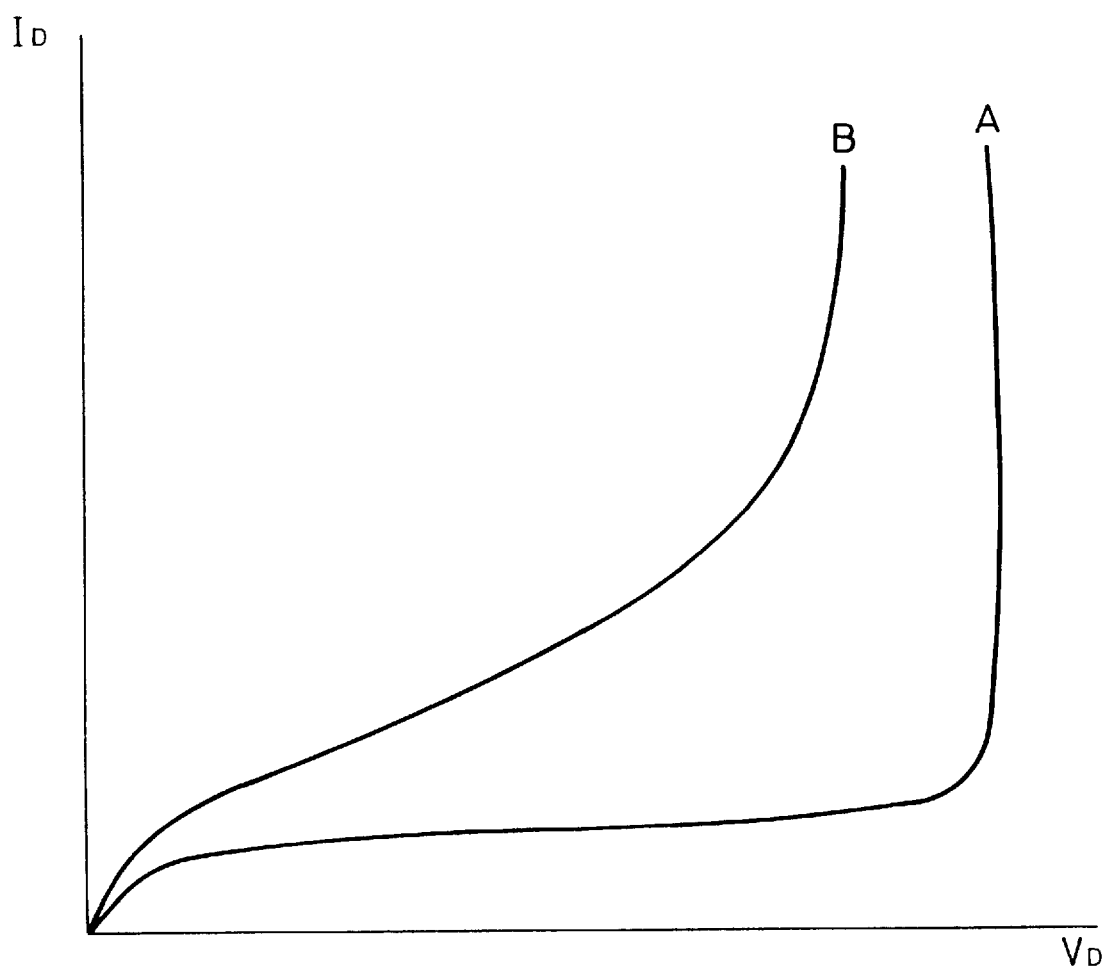
FIG. 3 is a graph showing a drain voltage ($V_D$)—drain current ($I_D$) relation obtained on a structure according to another embodiment of the present invention; there is also shown a $V_D$-$I_D$ relation for a device having a conventional structure.
Figure 4:
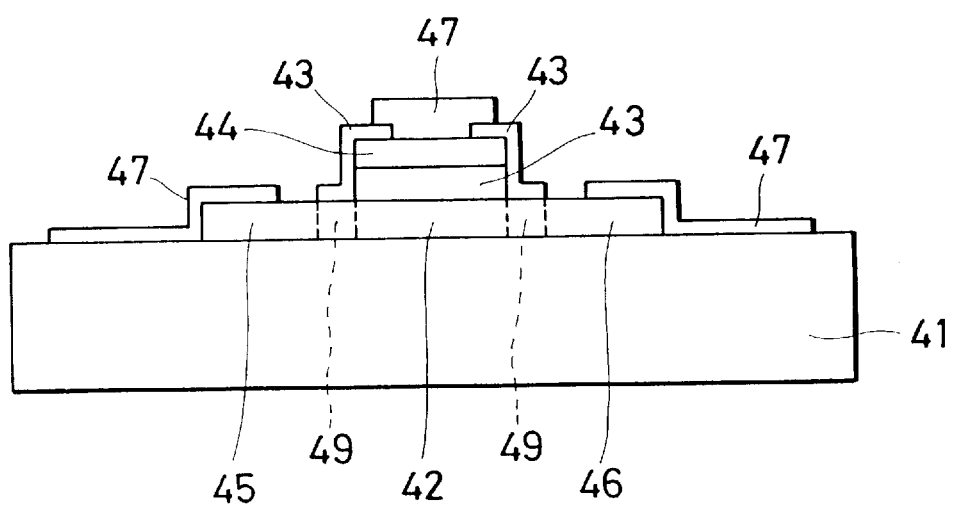
FIG. 4 is a schematic view of an insulated gate FET having a conventional structure.

In this embodiment, the source and drain in the PTFT or NTFT are established by ion implantation using an impurity such as boron for imparting the P type conductivity or phosphorus for imparting the N type conductivity and the gate electrode as a mask. So that, in the case of the NTFT, each of the boundary 61' between the source and the channel and the boundary 62' between the drain and the channel corresponds with each one boundary of the impurity regions having added thereto oxygen, as shown in FIG. 6(D). That is, the impurity regions having added thereto oxygen in this embodiment are present within the source and the drain of a semiconductor having added thereto an impurity for imparting one conductivity type, which composition is same as that in FIG. 1.

The feature of the fabrication process of this embodiment is that the locations of the source, the drain, the channel, and the region having added thereto such an impurity as carbon, nitrogen, and oxygen are determined during the step shown in FIG. 6(B) in which the location of the gate electrode is fixed. This is because the impurity such as carbon, nitrogen, and oxygen for establishing the large band gap and the impurity for imparting the N or P type conductivity are implanted using the gate electrode as a mask. Considering that to improve the yield and to lessen the variation of the device characteristic are the most important subjects when fabricating such as a liquid crystal display device, the above mentioned feature of this fabrication process is very useful. As will be explained below, if the location of the region adding thereto the impurity such as carbon, nitrogen, and oxygen to establish the wide band gap is different even slightly among some devices, the electrical property of the device becomes different accordingly, which results in the variation of the device characteristic.

After the step of forming the above gate electrodes, the photoresist 31 was removed and heat annealing was again carried out at 630° C. for 10 to 50 hours. Thereby, the impurities in the source 5 and the drain 6 in the PTFT and in the source 5' and the drain 6' in the NTFT were activated and $P^{30}$ and $N^{30}$ regions were established. Below the gate electrodes 4 and 4', channel forming regions 7 and 7' were formed of a semi-amorphous semiconductor. Generally speaking, the activation of source and drain regions is effective for enhancing electrical characteristic of a device, but there is a problem that the impurity for imparting the P or N type conductivity would drift unnecessarily into a channel forming region during the thermal annealing for the activation. With the composition of the present invention, however, in the case of this embodiment for example, the region having added thereto the impurity such as carbon, nitrogen, and oxygen which is present at an N+-I or I-N+ boundary or its vicinity serves as a blocking region since the impurity such as carbon, nitrogen, and oxygen combines tightly with silicon, so that the unnecessary drift of the impurity during thermal annealing can be prevented.

Figure 5:
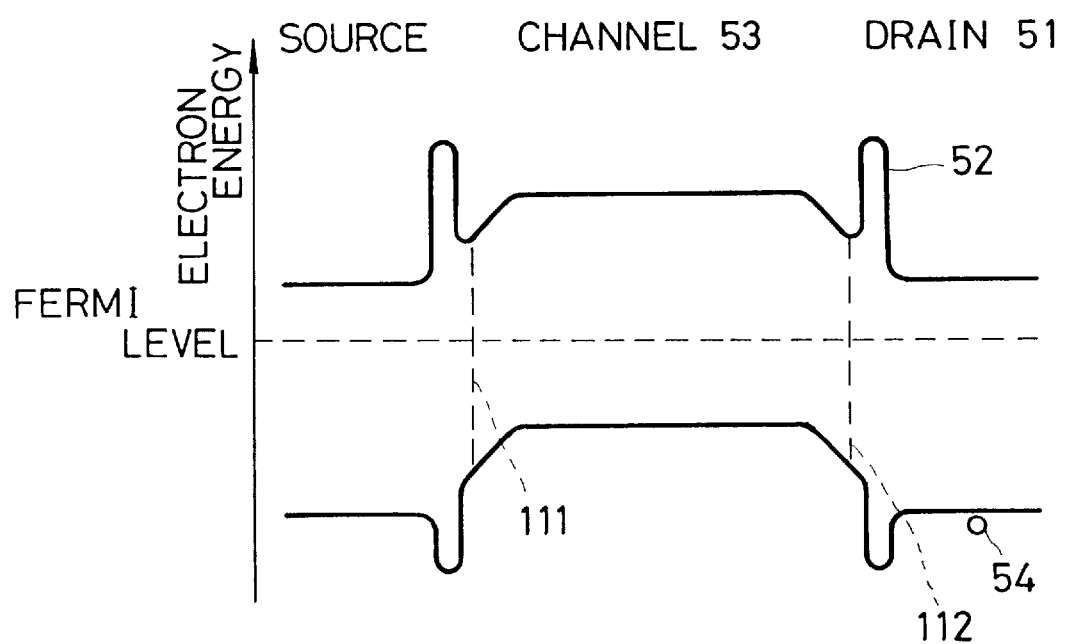
FIG. 5 is a schematic representation of an energy band for the structures according to the present invention.

The regions (I). (II), (I'), and (II') having added therein impurities such as oxygen are provided as regions having a wider band gap (see FIG. 5, 52) as compared with those of the channel, the source, or the drain. By taking such a structure, GBs can be eliminated from the plane in which the n$^+$-i and the p$^+$-i junctions are present, which result in a drain increased in resistance voltage.

As described in the foregoing, a C/TFT pair can be realized by a self-aligning method and yet without heating the structure to a temperature of 700° or higher. This excludes use of an expensive substrate such as of quartz and the like. It can be seen that the process is therefore best suited for producing liquid crystal devices having large pixel numbers The energy band structure of the NTFT fabricated in this example is same as that shown in FIG. 5 since the composition in this example is same as the NTFT shown in FIG. 1. The boundaries 61' and 62' of N$^+$-I or I—N$^+$ in the NTFT in FIG. 6 correspond with 111 and 112 in FIG. 5, respectively. In the case that the amount of the impurity having been doped into the PTFT is completely same as that in the NTFT and that the channel is an intrinsic semiconductor in both or the NTFT and the PTFT, the energy band structure of the PTFT fabricated in this embodiment is approximately the same as a structure that is formed by the symmetrical modification of the structure in FIG. 5 along the broken line indicating Fermi level ($f_e$).

Thermal annealing was conducted twice in the fabrication step illustrated by FIGS. 6(A) and 6(E). The annealing at the step of FIG. 6(A) can be omitted depending to the required device characteristics, and this annealing step may be included in the step of FIG. 6(E) for the sake of speeding up the process. Further, In the step illustrated by FIG. 6(F), an interlayer insulator 8 was provided by sputtering under the same conditions as employed in the previous deposition of the silicon oxide film. The silicon oxide film may be otherwise deposited by LPCVD or photochemical vapor deposition. The thickness of the film is, for example, in the range of from 0.2 to 1.0 μm. The silicon oxide film thus deposited was perforated using a photomask <6> as shown in FIG. 6(F), to obtain a window (opening) 32 for the electrode. The whole structure was further coated with aluminum film having a thickness In the range of from 0.5 to 1.0 μm by sputtering, to which further leads 9 and 9', as well as contacts 29 and 29', were fabricated using a photomask <7> as shown in FIG. 6(G).

The characteristics of the TFTs above are described briefly below. The p-TFT has a mobility, μ, of 26 cm$^2$/V·sec, a threshold voltage, $V_{th}$, of −4.3 V, and a drain voltage resistance of −33 V. The n-TFT has a mobility of 42 cm$^2$/V·sec, a $V_{th}$ of +3.9 V, and a drain voltage resistance of +37 V. The characteristics above are for the case having a channel length of 10 μm and a channel width of 30 μm. The use of such semiconductor devices enabled a high mobility which had been considered impossible with a TFT, and also a considerably increased drain voltage resistance. Accordingly, a n-TFT or a C/TFT pair for first use in a liquid crystal display device was fabricated as shown in FIG. 7.

In the fabrication of a liquid crystal display device according to the present example, an organic resin film 34 such as of polyimide was provided, which was perforated for a window (opening) again using a photomask <9> to transfer the output of this C/TFT pair to the pixels. An indium tin oxide (ITO) film was deposited by sputtering to connect the output ends of the two TETs with one of the transparent electrodes of the liquid crystal display device. The ITO film thus deposited was etched through a photomask <6> to fabricate a transparent electrode 33. The ITO film was deposited at a temperature 150° C. or lower but not lower than room temperature, and was then annealed in the atmosphere or in oxygen in the temperature range of from 200° to 300° C. Thus were established a p-TFT 21, an n-TFT 11, and a transparent ITO film electrode 33 on the same glass substrate 1.

Figure 8A:
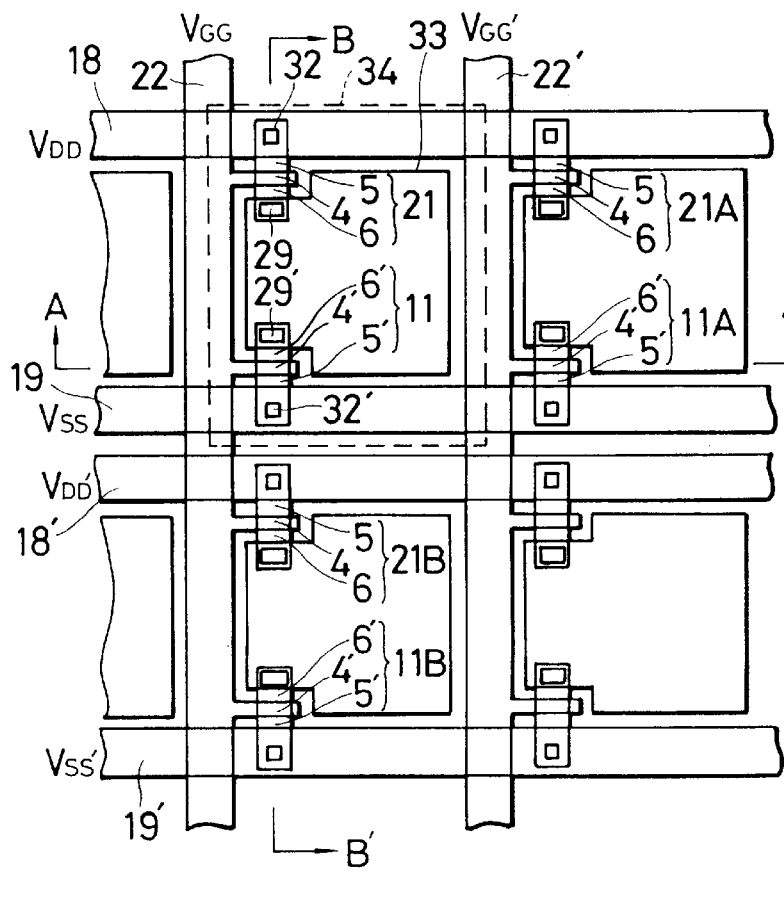
FIG. 8 is a schematic view or the structure of a device according to an embodiment of the present invention.

In FIG. 8(A) Is provided an example corresponding to the example illustrated in FIG. 7. In FIG. 8(A), $V_{DD}$ 18, Vss 19, $V_{DD}$, 18', and Vss' 19' are provided as the X lines, and $V_{GG}$ 22 and $V_{GG}$, 22' are provided as the Y lines.

Figure 8C:
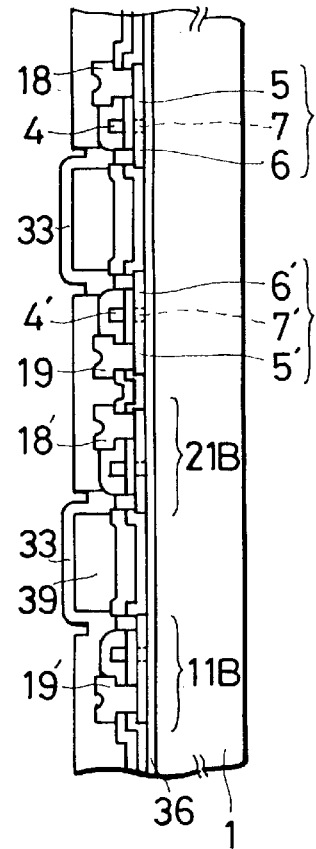
Figure 8B:
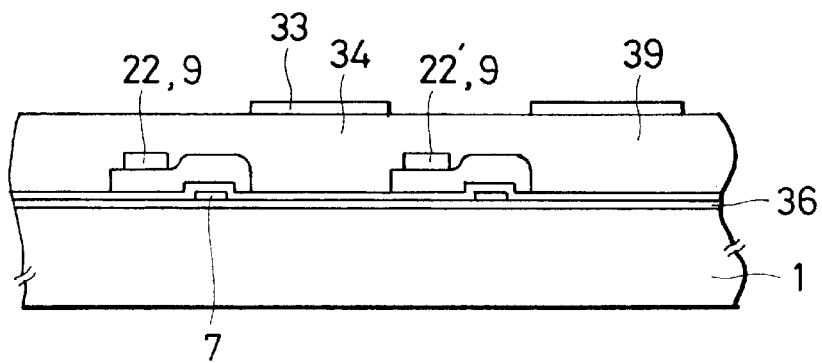

FIG. 8(B) shows a cross sectional view of the structure cut along the A–A' line as shown in FIG. 8(A). Similarly, a cross sectional view of the structure out along the B–B' line is shown in FIG. 8(C).

In this structure, the p-TFT 21 is established at the crossing or the X line, $V_{DD}$ 18, with the Y line, $V_{GG}$22. Similarly to the crossing of the $V_{DD}$ 18 with the $V_{GG}$, 22' is also provided a p-TFT 21A for another pixel. The n-TFT 11 is established at the crossing of the Vss 19 with the $V_{GG}$ 22. Under the crossing of the $V_{DD}$, 18' with the $V_{GG}$ 22 is provided a p-TFT for another pixel. Thus was constructed a matrix structure using C/TFTs.

The p-TFT is connected to an X line, $V_{DD}$ is, through a contact 32 at the input end of the source 5, and the gate 4 is connected to a Y line, $V_{GG}$ 22, having a multilayer structure. The output end of the drain 6 is connected through a contact 29 with an electrode 33 of a pixel.

The n-TFT 11, on the other hand, is connected to an X line, Vss 19 through a contact 32' at the input end of the source 5', and the gate 4' is connected to a Y line, $V_{GG}$ 22; the output end of the drain 6' is connected through a contact 29 with a pixel 33. Thus was fabricated a single pixel device between (inside) two X lines 18 and 19, using a pixel 33 comprising a transparent electrode and a C/TFT pair. BY extending the structure by reproducing the same structure in the horizontal and the vertical directions, a 2×2 matrix can be expanded to a large-pixel liquid crystal display devices having a 640×640 and 1280×1280 matrices.

The numerals used in FIGS. 8(B) and 8(C) correspond to those used in FIG. 8(G). The distinct features in this structure Is that the TETs are provided in a complementary configuration for a single pixel, and that the liquid crystal voltage $V_{LC}$ of the pixel 33 is fixed to either of the levels defined fly the state in which the p-TFT is ON with the n-TFT being OFF, or the state in which the p-TFT is OFF with the n-TFT being ON. In FIG. 8, the liquid crystal cell was fabricated by providing an orientation control film on a transparent conductive film having provided on a substrate, and applying a molecular orientation treatment thereto. The substrate thus provided with the orientation control film was integrated by a known process with the other substrate having provided thereto an electrode (as shown with 23 in FIG. 7) taking a constant spacing therebetween. The liquid crystal cell was completed by injecting a liquid crystal between the substrates or by wiring a liquid crystal therewith.

If a twisted nematic (TN) liquid crystal were to be used as the liquid crystal material, the substrates should be integrated taking a spacing of about 10 μm. Furthermore, the orientation control films should be provided to the transparent conductive film by applying a rubbing treatment. If a ferroelectric liquid crystal (FLC) were to be used, the cell should be fabricated at a spacing in the range of from 1.5 to 3.5 μm, for example, 2.3 μm, with the orientation control film being provided only to the opposite electrode (shown in FIG. 7 with 23) which is then subjected to a rubbing treatment. The function voltage in this case should be ±20 V. In using a dispersion type liquid crystal or a polymer liquid crystal, no orientation film is necessary, and to increase the switching rate, the function voltage is set in the range of from ±10 to ±15 V. The cell spacing in this case is In the range or from 1 to 10 μm.

Particularly in the case of a dispersion type liquid crystal, the quantity of light can be increased in either type of its use, i.e., as a transparent type or a reflective type, since it functions without incorporating a polarizer sheet. Furthermore, since the liquid crystal or this type has no threshold, the fabrication thereof into a C/TFT pair having a distinct threshold enables a high contrast and prevention of cross-talk (undesired interference from the neighboring pixels).

EXAMPLE 2

This example provides another method for fabricating a semiconductor device on a substrate. The method comprises the step or patterning a resist, semiconductor, insulator, or metal, or a complex thereof together with forming an opening for adding at least one element selected from the group consisting of carbon, nitrogen, and oxygen; and the step of adding at least one element selected from the group consisting of carbon, nitrogen, and oxygen. For example, It Is used as a method for fabricating a C/TFT pair shown in FIG. 9(C). The difference between the process in EXAMPLE 1 and the present process is that the process of EXAMPLE 1 comprises a step of ion-doping the impurities such as carbon, nitrogen, and oxygen to the semiconductor layer 2 and 2' using gate electrodes 4 and 4' as well as the resist films thereon as the masks (see FIGS. 6(B) and 6(C)), whereas the process of the present EXAMPLE comprises ion-doping first the impurities such as carbon, nitrogen, and oxygen to the semiconductor layer 2 and 2' shown in FIG. 6(A) using the resist film as the mask, to achieve an impurity concentration In the range of from $1 \times 10^{20}$ to $5 \times 10^{21}$ cm$^{-3}$ by ion-implantation (see FIG. 9(A)). This process is advantageous in that the impurity region (corresponding to the region having a wide band gap indicated by 52 in FIG. 5) having added thereto carbon, nitrogen, oxygen, and the like can be provided over an area under the gate electrode.

The process of the present EXAMPLE is described in detail below.

Figure 9:
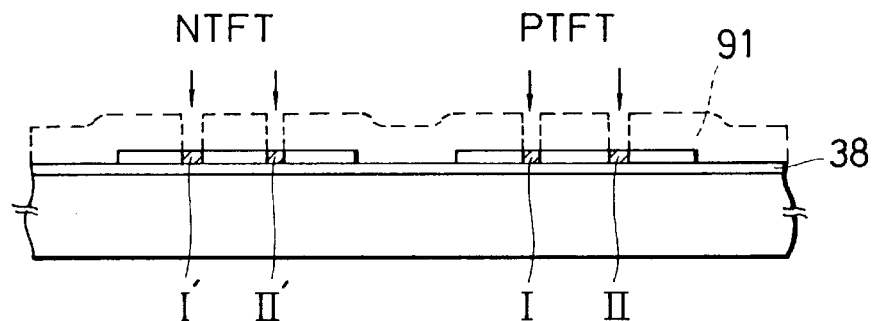
FIG. 9 is a schematic representation illustrating a fabrication process of an insulated gate FET according to another embodiment of the present invention.
Figure 9:
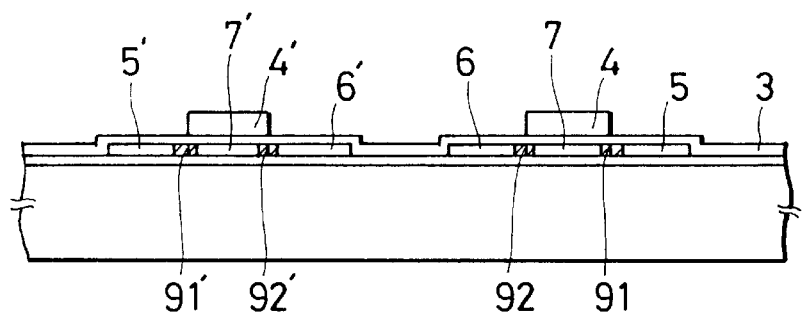
Figure 9:
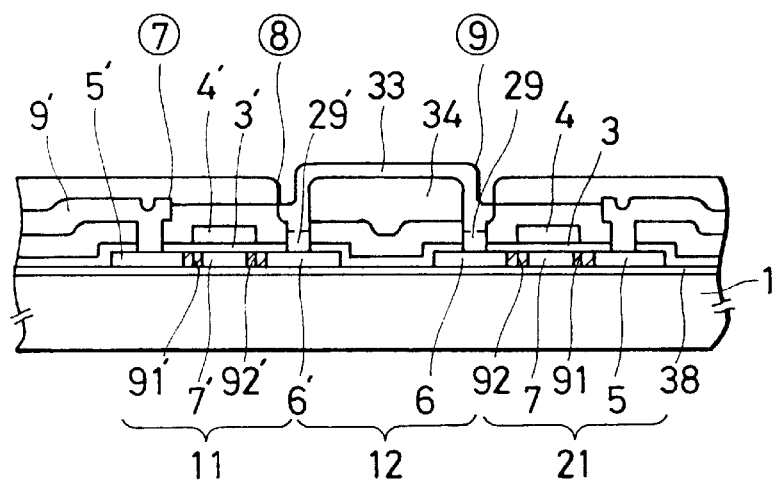

FIG. 9 illustrates a part of the process according to an embodiment of the present invention. First a structure as shown in FIG. 6(A) was fabricated by a process similar to that described in EXAMPLE 1. To this structure was provided a photoresist 91, and patterning was conducted to give the structure of FIG. 9(A), using a photomask. The impurity regions to which the impurity carbon, nitrogen, or oxygen is added were determined upon removal of the photoresist 91. Thus, it can be seen that the process according to the present EXAMPLE is capable of providing impurity regions under the gate electrodes, which was not possible by the ion implantation of EXAMPLE 1. Thus, an impurity, which is at least one element selected from carbon, nitrogen, and oxygen, was doped by ion implantation to the semiconductor layer using the photoresist 91 as the mask. In this EXAMPLE, oxygen was used as the impurity.

On the resulting structure was deposited a 1,000 Å thick silicon oxide film by sputtering in a 100% oxygen atmosphere, to provide a gate oxide film following the same process as that used in EXAMPLE 1. Thereafter, a silicon film containing phosphorus at a concentration of from $1\times10^{20}$ to $5\times10^{20}$ cm$^{-3}$, or a multilayer film comprising this silicon film having provided thereon molybdenum (Mo), tungsten (W), MoSi$_2$, or WSi$_2$, was deposited on the surface of the previously deposited silicon oxide film. By patterning this film using a known process, an n-TFT and a p-TFT comprising gate electrodes 4 and 4' were obtained. A C/TFT pair was finally obtained thereafter by following the same process as used in the EXAMPLE 1.

In this embodiment, the regions having added thereto a carbon element at $1\times10^{20}$ to $5\times10^{21}$ atoms per cm$^3$ by ion implantation are provided prior to the formation of the gate electrodes, so that the location of the regions having added thereto carbon for establishing the large band gaps is not limited by the location of the gate electrodes. In the case of the addition of the impurity using the gate electrodes as masks as in Embodiment 1, it was not possible to provide, under the gate electrodes, semiconductor regions having added thereto at least one of such impurities as carbon, nitrogen, and oxygen (which regions correspond to the large band gaps designated by numeral 52 in FIG. 5), as is apparent in FIG. 6(D). In Example 1, since the impurity for imparting one conductivity type was added using the gate electrodes as masks, the channel forming regions 7 and 7' were formed below and in the same form of the gate electrodes 4 and 4' as in FIG. 6(D). In accordance with this example, however, silicon semiconductor regions II and I' having added thereto carbon can be provided extending from the source regions 5 and 5' to the channel forming regions 7 and 7', and also silicon semiconductor regions I and II' having added thereto carbon can be provided extending from the drain regions 6 and 6' to the channel forming regions 7 and 7'. The boundaries between the source regions 5 and 5' and the channel forming regions 7 and 7' are located as designated by numerals 91 and 91', and the boundaries between the drain regions 6 and 6' and the channel forming regions 7 and 7' are located as designated by numerals 92 and 92'. Thus the boundaries between the source and drain regions and the channel forming regions are located within the silicon semiconductor regions having added thereto carbon.

The energy band structure of the NTFT in accordance with this example is schematically illustrated in FIG. 10. In the case of fabricating an NTFT in accordance with the fabrication process of this example, the region corresponding with the large band gap 101 shown in FIG. 10, which is obtained by adding the impurity such as carbon, nitrogen, and oxygen, can be placed closer to the channel forming region 53, compared with the case of the NTFT fabricated by the process in Embodiment 1. Further, even when a large band gap as large as that in Embodiment 1 is provided, if the location of the large band gap is different from that in Embodiment 1, the height of the large band gap functioning as a potential barrier becomes different relatively. For example, when comparing the vicinity of the boundary 112 in FIG. 5 between the channel and the drain with that 92' in FIG. 10, it is realized that although the size of the band gap obtained by the addition of the impurity such as carbon, nitrogen, and oxygen is the same in both cases, the height thereof as a potential barrier is different from each other for carriers and electrons.

Figure 11:
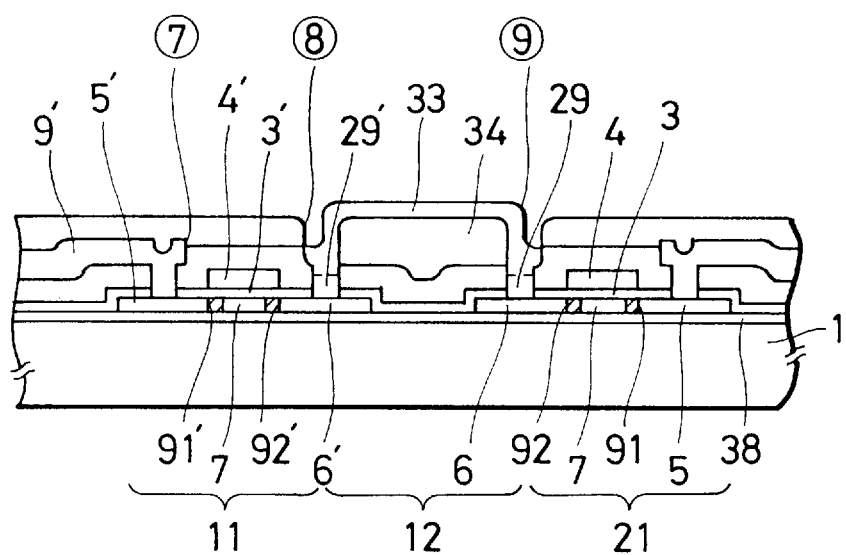
FIG. 11 is a schematic view or the structure or a device according to another embodiment of the present invention.
Figure 13:
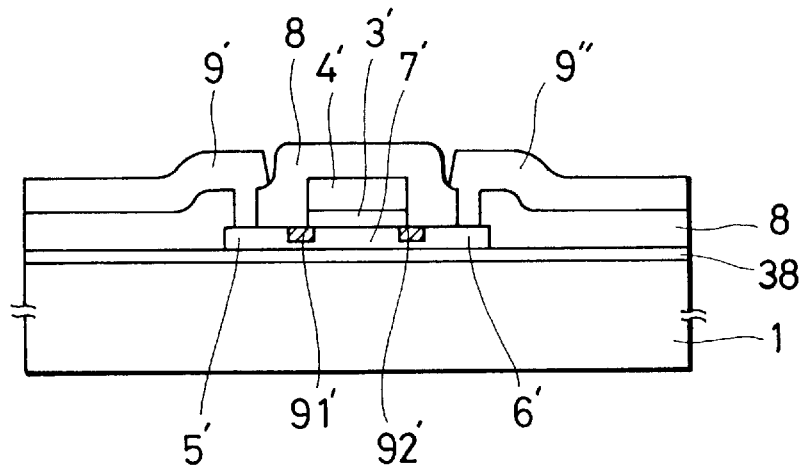
FIG. 13 is a schematic cross sectional view showing a semiconductor device according to the present Invention.

Further, a C/TFT pair comprising an NTFT and a PTFT as shown in FIG. 11 can be fabricated in accordance with the present invention in place or the C/TFT pair shown In FIG. 9(C). The C/TFT thus fabricated is the same as that fabricated in Example 1 shown in FIG. 9(C) except for the location of the regions having added thereto carbon at $1\times10^{20}$ to $5\times10^{21}$ atoms per cm$^3$. As can be seen in FIG. 11, the two ends of the impurity regions having added thereto carbon correspond with the boundaries 91, 91' between the sources 5, 5' and the channels 7, 7' and the boundaries 92, 92' between the drains 6, 6' and the channels 7, 7', and the impurity regions, i.e. the regions forming large band gape, are located within the channel forming regions 7 and 7'.

An energy band structure of the NTFT illustrated In FIG. 11 is shown in FIG. 12. Since the impurity regions having added thereto carbon are provided within the channel forming region, the large band gaps 101 are located on the channel forming region side from the boundary 91' between the source and the channel and from the boundary 92' between the drain and the channel, compared with the case of FIG. 5 in Embodiment 1 and FIG. 10 in Embodiment 2. In this case too, if the band gap of the regions having added thereto carbon is the same in size but different in location compared therewith, the height of the band gap for the electrons and carriers (holes) becomes different.

Further, the width and the height of the large band gap can be controlled depending upon such as the impurity concentration, the lateral width, and the activation degree of the regions having added thereto at least one element selected from the group consisting of carbon, nitrogen, and oxygen.

EXAMPLE 3

Figure 25:
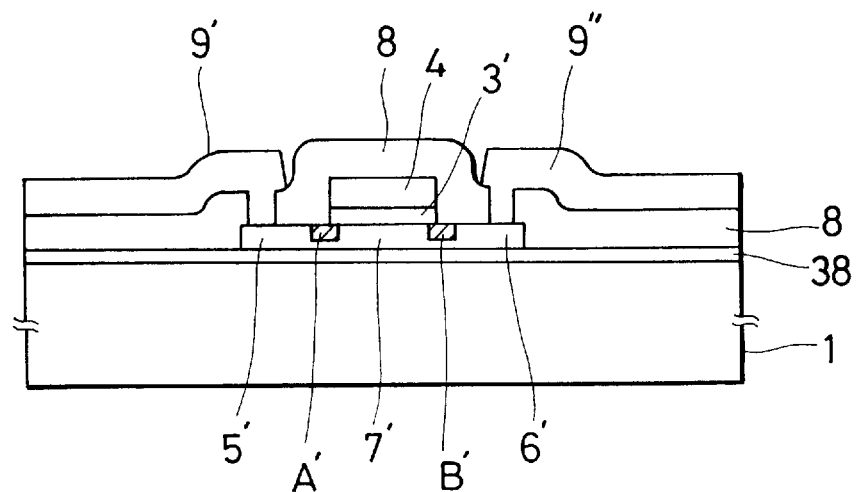
FIG. 25 is a schematic cross sectional view snowing a semiconductor device according to the present invention.

Referring to FIG. 25, a TFT similar to that fabricated in EXAMPLE 2 is described, only that the TFT of the present EXAMPLE comprises the impurity regions at the vicinity of the surface of the semiconductor layer. The structure thus obtained also is increased in the voltage resistance between the source and the drain. Those impurities, of course, may be present deep inside the semiconductor layer to the vicinity of the substrate, but the structure of the present EXAMPLE is advantageous in that the impurities such as carbon, nitrogen, and oxygen can be doped with a lower ion energy as compared with the processes of EXAMPLES 1 and 2. Furthermore, ion intrusion to undesired areas can be avoided. In the FIGURE, the numerals and the symbols are the same as those used in FIG. 1. Both a p-channel type and a n-channel type naturally can be used as the insulated gate FET described herein.

An insulated gate FET was thus fabricated by following the same process as described in EXAMPLE 2, except for applying a voltage of 40 KeV or lower, for example, 25 KeV, at the ion implantation of carbon, nitrogen, or oxygen. Furthermore, the structure may be similar to that described in FIG. 1.

EXAMPLE 4

Referring to FIG. 21, a process for fabricating a complementary TFT (C/TFT) pair is described. The C/TFT pair comprises an n-channel TFT and a p-channel TFT provided on a glass substrate at a complementary structure.

The device of this type is employed in a memory device portion of a logic circuit and a static random access memory (SRAM) or in a semiconductor integrated circuit such as a peripheral circuit for various memory devices including the SRAM. As shown In FIGS. 21(C) and 21(D), the CMOS has a structure that the drain electrode 611a in the P channel type transistor is connected to the source electrode 610b in the N channel type transistor by the lead 612 and further the gate electrode 604a in the P channel type transistor is connected to the gate electrode 604b in the N channel type transistor by the lead 613. The fabrication process of this device will be explained below with reference to FIG. 21.

Figure 21A:
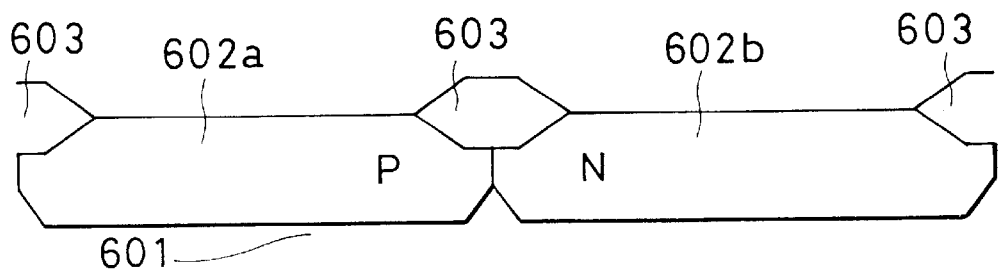
FIGS. 21(A) to 21(C) are schematic cross sectional views showing a method for forming a semiconductor device according to the present invention.

Referring to FIG. 21(A), a P type impurity region 602a and an N type impurity region 602b are formed on a single crystal silicon semiconductor of high resistance 601 by known impurity diffusion technique, for example, by ion implantation, and field insulating films 603 are formed by known field Insulating film formation technique such as so-called LOCOS technique. Boron is preferred as the impurity added for imparting the P type conductivity, and phosphorus or arsenide is for imparting the N type conductivity. Also the impurity concentration of $10^{14}$ to $10^{17}$ atoms per $cm^3$ is desirable. However, the kind of impurity to add and the concentration thereof should be selected depending on the characteristic of the device to be fabricated and the fabrication process thereof. Generally, it is required from the scaling rule that the impurity concentration in the channel forming region is increased as the device is made small and thus the channel is made short.

In this embodiment, a substrate having the N type conductivity and the resistivity of 10 Ω·cm is used, and boron and phosphorus are added to the substrate at about $10^{16}$ atoms per $cm^3$ by ion implantation, respectively, to thereby establish the P type region 602a and the N type region 602b. Further, the field insulating films 503 are formed by the known LOCOS technique.

Then, a gate insulating film having a thickness of 5 nm to 40 nm is formed by known dry oxidizing method. Silicon oxide having a thickness of 10 nm is formed by heat oxidization in this embodiment. Further, a polycrystalline silicon film 604 containing phosphorus is formed thereon. The concentration of the phosphorus is preferably from $10^{19}$ to $10^{22}$ atoms per $cm^3$. In this embodiment a polycrystalline silicon film containing phosphorus at $10^{21}$ atoms per $cm^3$ and having a thickness of 200 nm was formed. The polycrystalline silicon film may be formed by the conventional heat decomposition method using monosilane or disilane, but it may also be crystallized by the subsequent step such as laser annealing and heat annealing after being formed by the plasma vapor reaction using glow discharge of such as monosilane or disilane. Particularly, the latter process has an advantage that the diffusion of the impurity from the polycrystalline silicon to the underlying semiconductor layer can be prevented to the utmost. Although the conventional heat decomposition method is employed in this example, it is, of course, possible to use the method utilizing glow discharge.

Then, the polycrystalline silicon film is selectively removed to form gate electrodes 604a and 604b together with grooves 605 on both sides thereof. The width of 0.2 to 20 μn is desirable for the gate electrodes. In this embodiment, the width of the gate electrodes was 0.4 μm. The width of the grooves, that is to determine the size of FDD regions later, is desirably 0.03 to 20 μm in general. The width of groove is fixed depending on the characteristic of the device to be fabricated and so on, and in this embodiment it was fixed to 0.1 μm. Then, oxygen ions are implanted into the substrate at 0.1 to $20 \times 10^{15}$ ions per $cm^2$, using the remaining polycrystalline silicon film as a mask. Nitrogen ions, carbon ions, or mixture of them may be used in place of the oxygen ions. In this embodiment oxygen ions were implanted at $2 \times 10^{15}$ ions per $cm^2$. The depth of the ion implantation was measured to be about 0.5 μm, so that the concentration of oxygen atoms was assumed to be $4 \times 10^{20}$ atoms per $cm^3$. FDD regions 606a to 606d are thus established.

During the ion implantation, the oxygen Ions directly entering the polycrystalline silicon film would degrade the characteristic of the film. For avoiding the degradation, a film such as photoresist having a sufficient thickness may be provided on the polycrystalline silicon film in advance, that is, the gate electrodes and the grooves are formed by selectively removing the photoresist film provided in advance and the polycrystalline silicon film at the same time. By doing so, the oxygen ions do not reach the polycrystalline silicon film during the ion implantation using the oxygen ions.

Figure 21B:
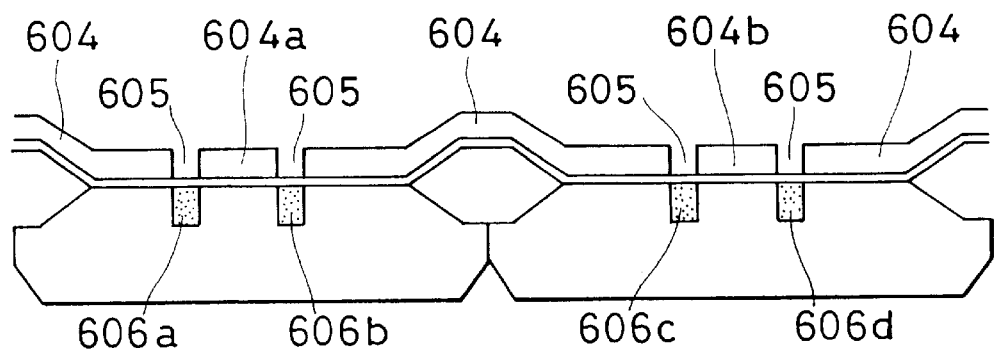
Figure 21C:
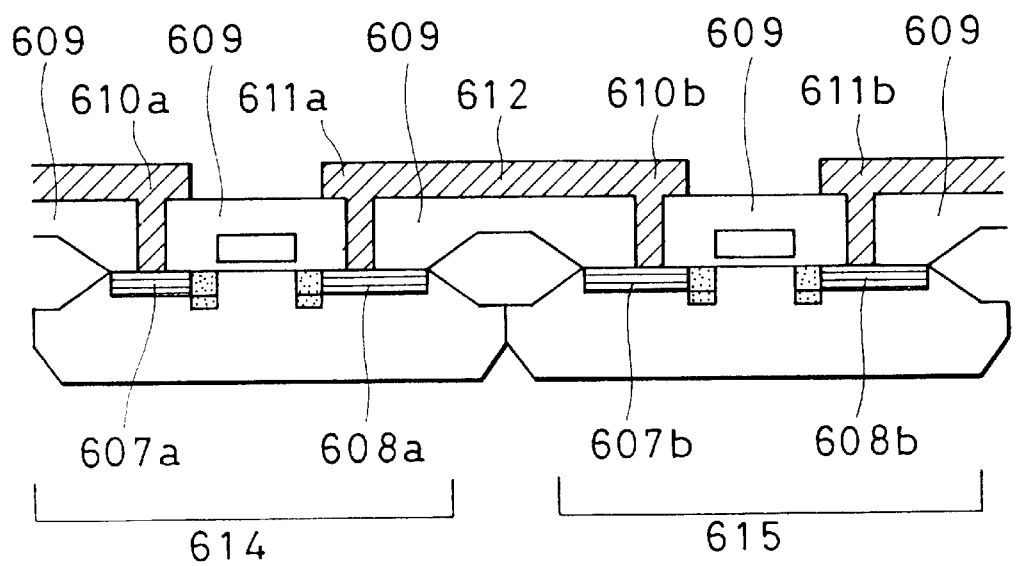
Figure 21D:
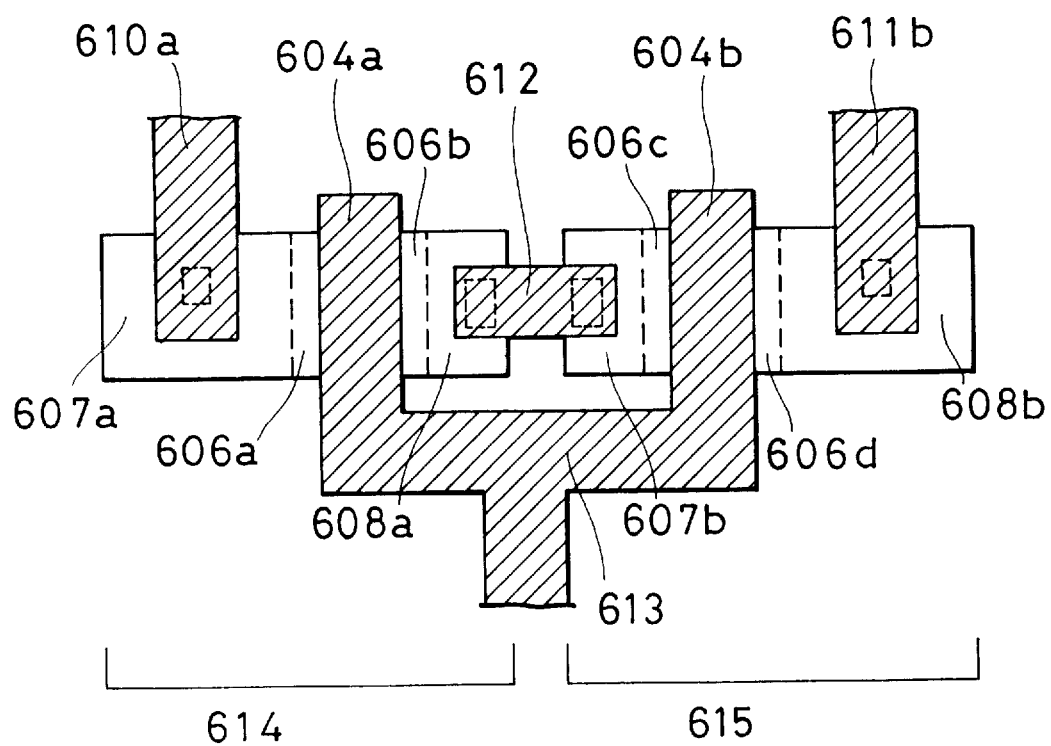
FIG. 21(D) is a schematic plan view showing the semiconductor device illustrated in FIG. 21(C)

The structure shown in FIG. 21(B) is obtained in the above manner.

Then, the polycrystalline silicon film except for the gate electrodes is removed, and impurity regions to be sources and drains are formed in the substrate by ion implantation using the gate electrodes as masks in a self-aligning manner. That is, an impurity such as phosphorus or arsenide is added for imparting the N type conductivity to the P type region 602a and an impurity such as boron is added for imparting the P type conductivity to the N type region 602b. The technique usually used when fabricating CMOS is employed for establishing these impurity regions. The impurity concentration is desirably $10^{19}$ to $10^{22}$ atoms per $cm^3$. In this embodiment, arsenide and boron were added to the P type region 602a and the N type region 602b at $10^{21}$ atoms per $cm^3$, respectively. Thus a source 607a and a drain 608a are established in the P type region 602a and a source 607b and a drain 608b are established in the N type region 602b. This structure is then annealed at 800° to 1000° C. for 1 to 30 hours in the diffusion furnace. In this embodiment, it was annealed at 900° C. for 30 hours.

An interlayer insulating layer 609 is formed on the entire surface by known low pressure CVD and the like followed by forming openings therein. Then a metal film of such as aluminum is formed selectively to be source and drain electrodes 610a and 611a and source and drain electrodes 610b and 611b. By selectively leaving the aluminum film, the drain electrode 611a formed on the P type region is connected to the source electrode 610b on the N type region by means of a lead 612, as shown in FIG. 21(C). FIG. 21(D) illustrates the device thus obtained, seen from the upper side thereof.

The gate electrode used in this embodiment was a single layer of polycrystalline silicon, however, it may be of lamination structure comprising polycrystalline silicon and metal tungsten (or metal molybdenum) or tungsten silicide (or molybdenum suicide), a single layer or such as metal molybdenum and metal tungsten, a single layer of such as molybdenum silicide and tungsten suicide, a single substance or polycrystalline germanium, an alloy of silicon germanium, or may be a laminated multi-layer comprising polycrystalline germanium, silicon germanium alloy and the above material.

EXAMPLE 5

Figure 22A:
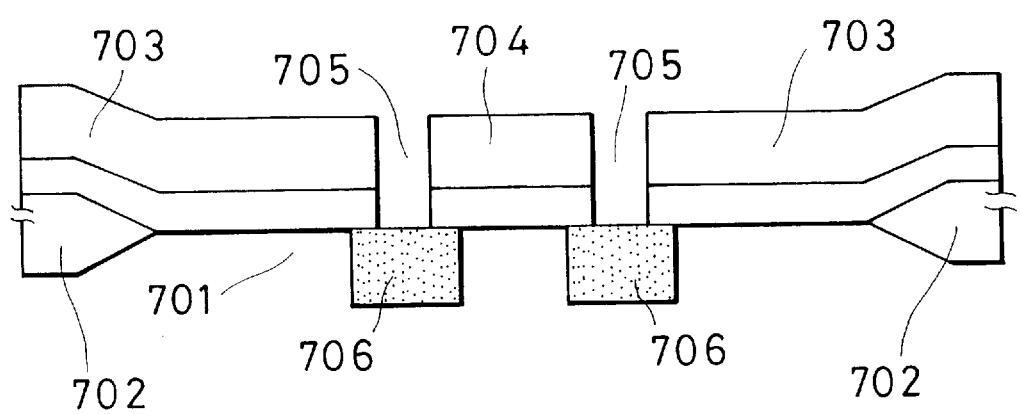
FIGS. 22(A) to 22(D) are schematic cross sectional views showing a method for forming a semiconductor device according to the present invention.

This example is explained with reference to FIG. 22, though detailed values and materials are the same as in EXAMPLE 4 and thus omitted. On a P type single crystal silicon substrate 701, field insulating films 702, a gate insulating film and a polycrystalline silicon film 703 are formed. The polycrystalline silicon film and the gate insulating film are selectively removed so as to obtain a gate electrode 704 and grooves 705 on the both sides of the gate electrode. Oxygen ions are then implanted to the portions of the semiconductor substrate exposed by the grooves to thereby establish FDD regions 706 as shown in FIG. 22(A).

Figure 22B:
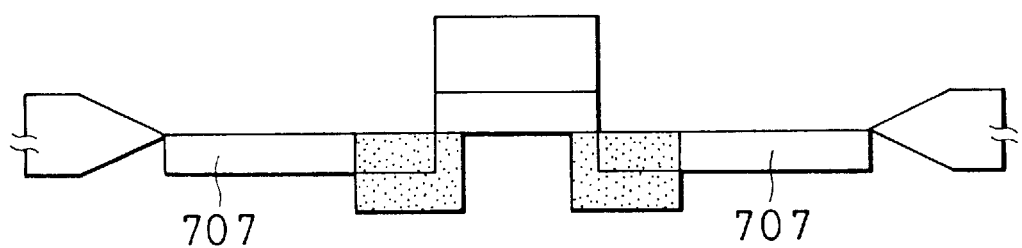

Then, as seen in FIG. 22(B), the polycrystalline silicon except for the gate electrode is removed, and $n^-$-type impurity regions 707 having relatively low impurity concentration is established using the gate electrode and the field insulating films as masks.

Figure 22C:
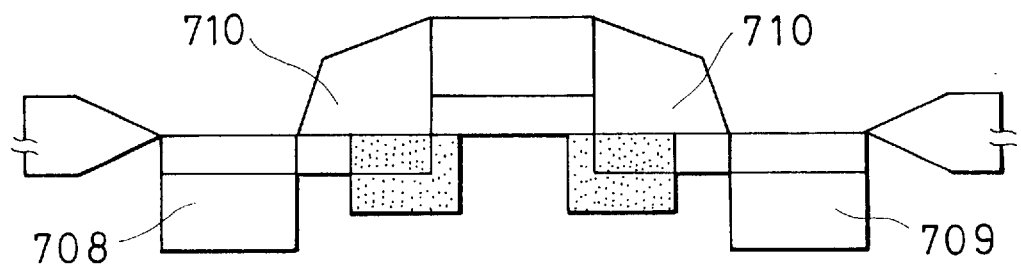
Figure 22D:
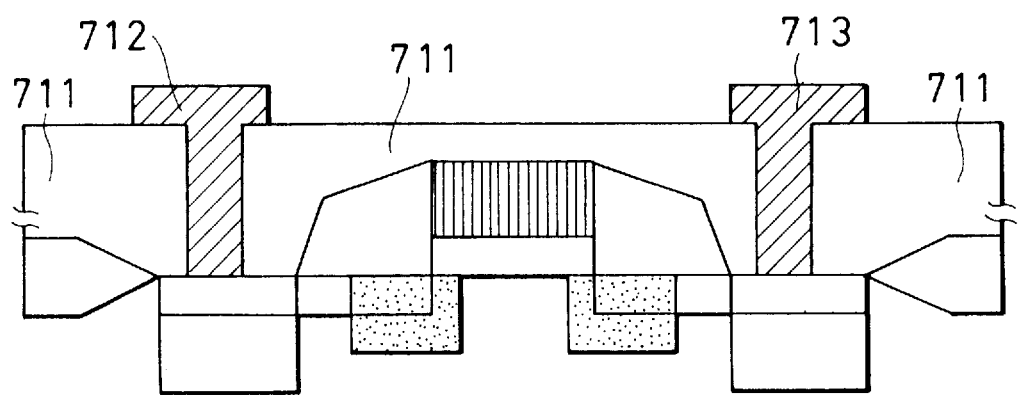

A silicon oxide film having a thickness of 1 to 5 μm is formed on the entire surface by for example plasma CVD and then removed by known anisotropic etching technique with the silicon oxide film being left only on the both sides of the gate electrode, as designated by numeral 710 in FIG. 22(C). After that, an N type impurity is added by ion implantation using the remaining silicon oxide films 710 and the field insulating films as masks, whereby a source region 708 and a drain region 709, both of which have higher impurity concentration, are established. Thus the structure in FIG. 22(C) is obtained. The above process is used for establishing a known LDD structure and is recited for example in page 23 of "VLSI Fabrication Technique" (Tokuyama at al., Nikkei BP, published in 1989).

Lastly, an interlayer insulating layer 711 is formed on the entire surface. After forming openings in the insulating layer, metal electrodes 712 and 713 are formed on the source and drain regions, thus an insulated gate field effect transistor is obtained, a& shown in FIG. 22(D).

EXAMPLE 6

Figure 23A:
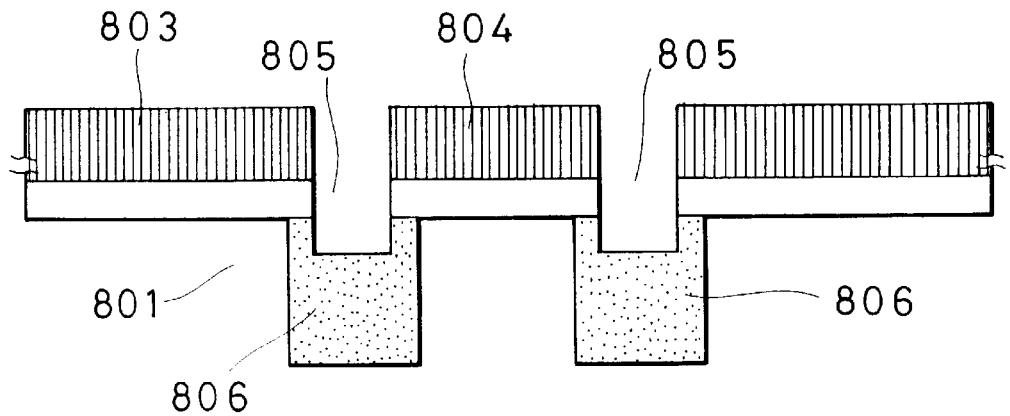
FIGS. 23(A) to 23(C) are schematic cross sectional views showing a method for forming a semiconductor device according to the present invention.

This example is explained with reference to FIG. 23, though detailed values and materials are the same as in EXAMPLE 4 and thus omitted. Referring to FIG. 23(A), a gate insulating film and a polycrystalline silicon film 803 are formed on a P type single crystal silicon substrate 801. The polycrystalline silicon film, the gate insulating film, and a part of the semiconductor substrate are selectively removed so as to obtain a gate electrode 804 and grooves 805 on the both sides of the gate electrode. Oxygen ions are implanted to the portions of the semiconductor substrate exposed due to the grooves and thereby FDD regions 806 are established. The depth of the grooves formed in the semiconductor substrate is 10 nm to 500 nm, 100 nm in this example. The structure of FIG. 23(A) is thus obtained.

Figure 23B:
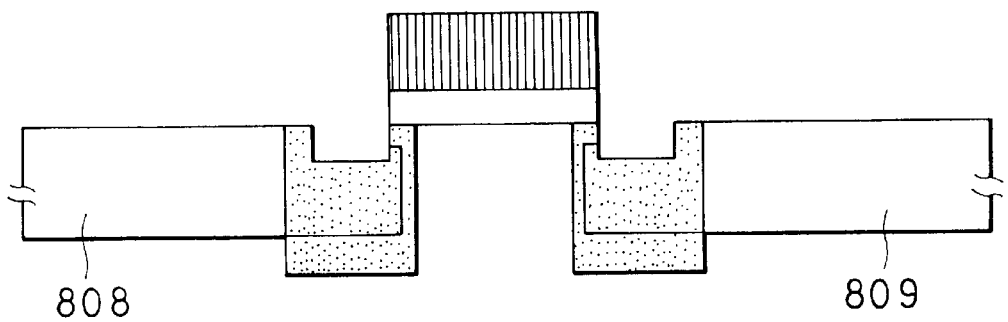
Figure 23C:
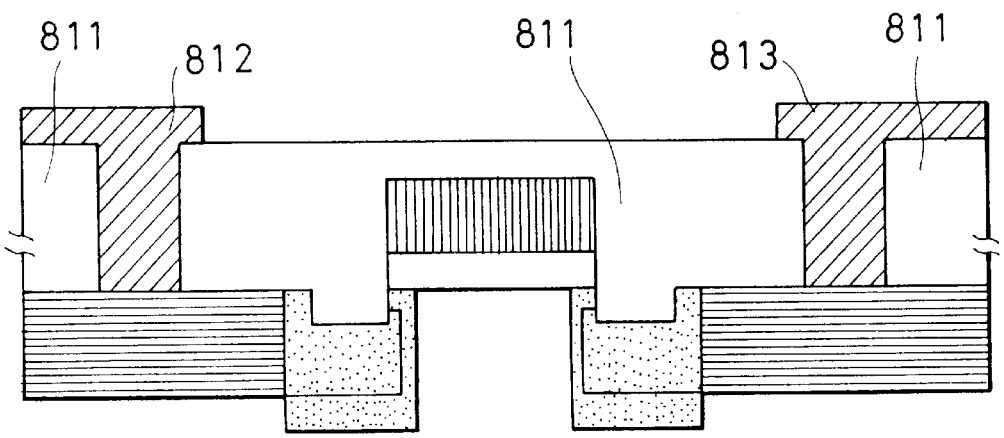

Then, the polycrystalline silicon except for the gate electrode is removed, and N type impurity ions are added by ion implantation using the gate electrode as a mask to thereby establish a source region 808 and a drain region 809, as shown in FIG. 23(B).

Lastly, an interlayer insulating layer 811 is formed on the entire surface. After forming openings in the insulating layer, metal electrodes 812 and 813 are formed on the source and drain regions, whereby an insulated gate FET is obtained as in FIG. 23(C).

EXAMPLE 7

Figure 24A:
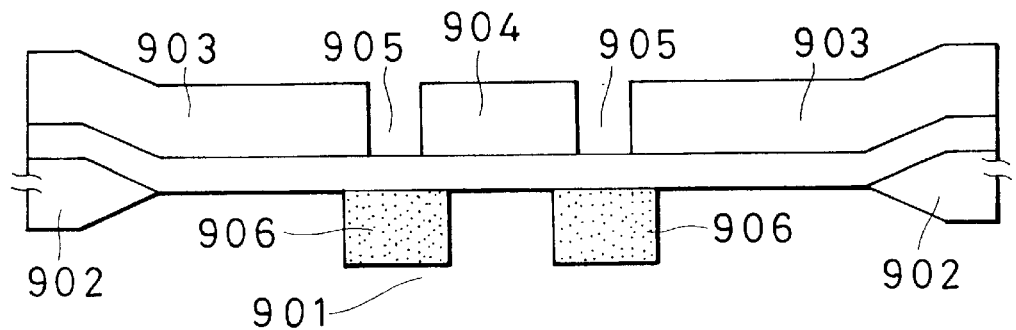
FIGS. 24(A) to 24(C) are schematic cross sectional views showing a method for forming a semiconductor device according to the present invention.

This embodiment is explained with reference to FIG. 24, though detailed values and materials are the same as in EXAMPLE 4 and thus omitted. Referring to FIG. 24(A), field insulating films 902, a gate insulating film, and a polycrystalline silicon film 903 are formed on a P type single crystalline silicon sudstrate 901. The polycrystalline silicon film and the gate insulating film are selectively removed so as to obtain a gate electrode 904 and grooves 905 on the both sides of the gate electrode. Oxygen ions are implanted to the portions of the semiconductor substrate exposed due to the grooves to thereby establish FDD regions 906, as shown in FIG. 24(A).

Figure 24B:
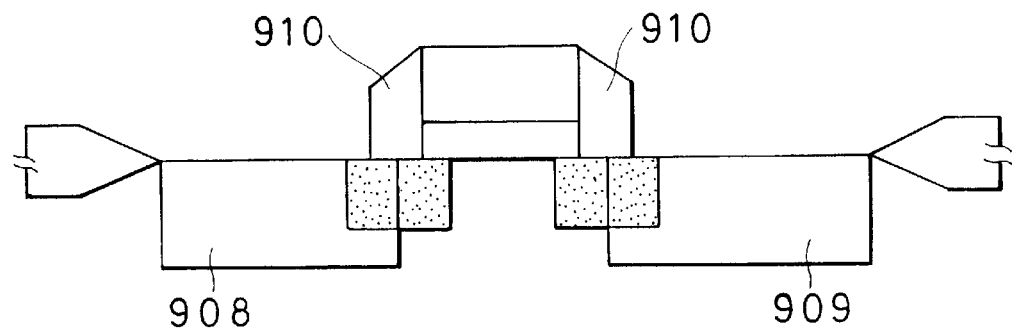
Figure 24C:
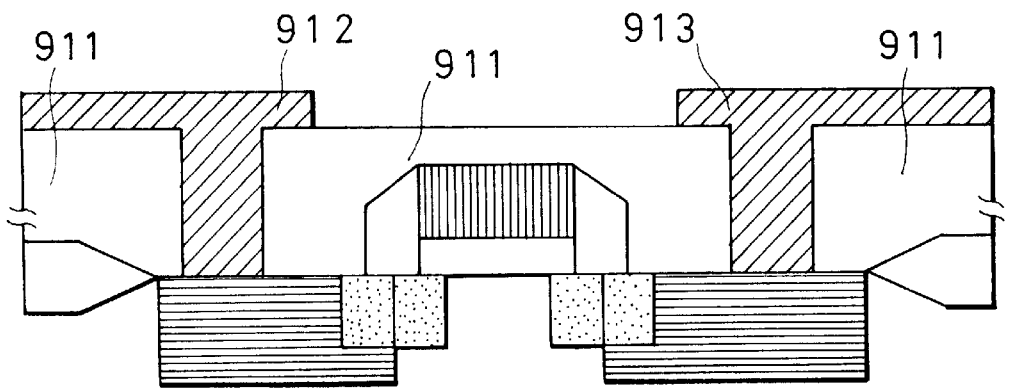

Then, the polycrystalline silicon except for the gate electrode is removed and a silicon oxide film having a thickness of 1 to 5 μm is formed on the entire surface by for example plasma CVD. The silicon oxide film is removed by known anisotropic etching technique with the silicon oxide being left only on the both sides of the gate electrode, as designated by numeral 910 in FIG. 24(B). After that, an N type impurity is added by ion implantation using the silicon oxide 910 and the field insulating films as masks, whereby a source region 908 and a drain region 909 are established, as shown in FIG. 24(B). The above process is used for establishing the known LDD structure, and is recited for example in page 23 of "VLSI Fabrication Technique" (Tokuyama et al., Nikkei BP, published in 1989).

Lastly, an interlayer insulating layer 911 is formed on the entire surface and subsequently openings are formed in the insulating layer. Metal electrodes 912 and 913 are formed on the source and drain regions respectively, whereby an insulated gate FET is obtained as in FIG. 24(C).

EXAMPLE 8

Figure 14:
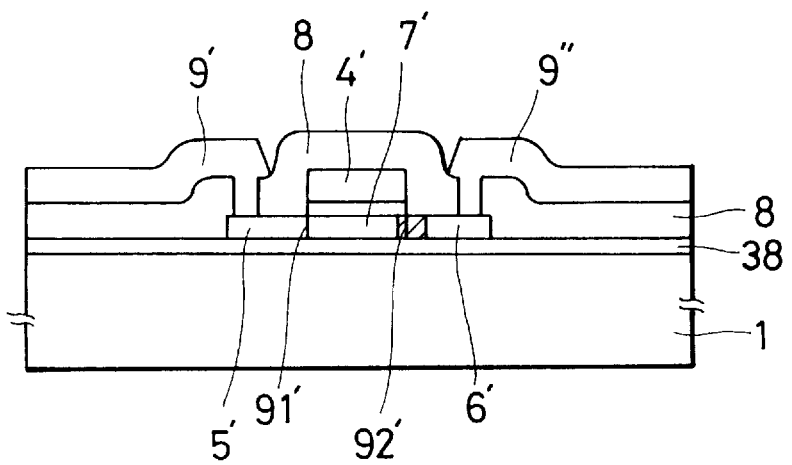
FIG. 14 is a schematic cross sectional view showing a semiconductor device according to the present invention.

Referring to FIG. 14, an insulated gate PET according to another embodiment of the present invention is described. This semiconductor device comprises a region having added thereto carbon at the vicinity of the boundary between the drain and the semiconductor film under the gate electrode. The structure according to the present EXAMPLE is simple, and yet has an improved dielectric strength.

The fabrication process of this example is the same as that in EXAMPLE 2. Therefore, the region having added thereto carbon is provided extending from the channel to the drain, including therein the boundary 92' between the channel and the drain.

Figure 15:
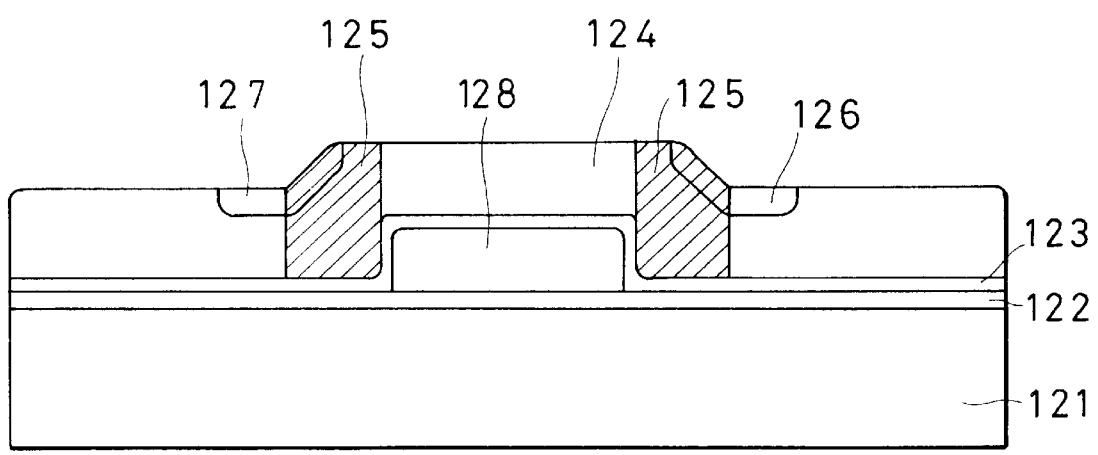
FIG. 15 is a schematic cross sectional view showing a semiconductor device according to the present invention.

According to the concept of the present invention, the effects thereof can be realized on an inverted stagger type FET as shown in FIG. 15, by adding impurities such as carbon, nitrogen, and oxygen to tho portion 125 of the inverted stagger type FET by using ion implantation following the same procedure of EXAMPLE 1. The mask, which is a resist in the foregoing description, may be a semiconductor, an insulator, a metal, or a composite thereof, and this mask may constitute a part of the semiconductor device.

Figure 16:
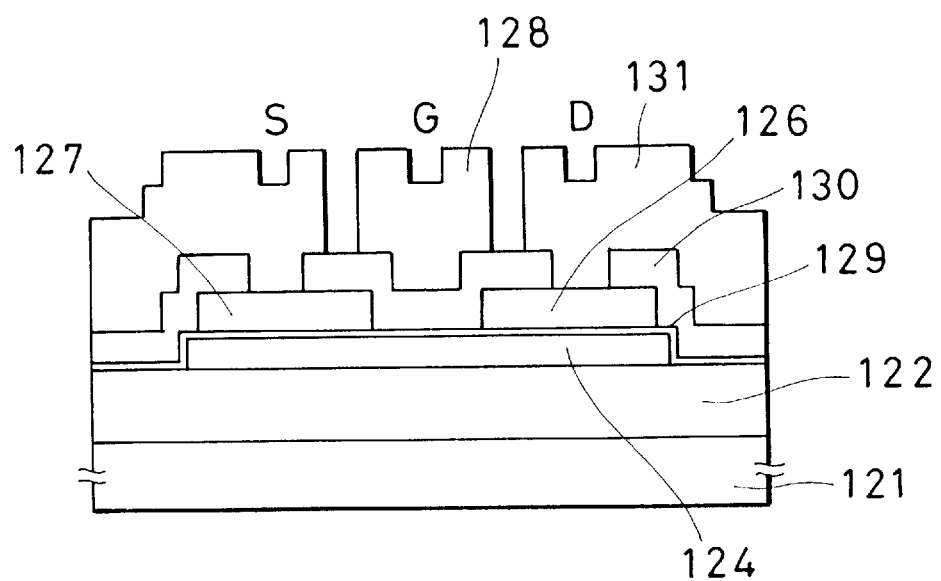
FIG. 16 is a schematic cross sectional view showing a semiconductor device according to the present invention.
Figure 17:
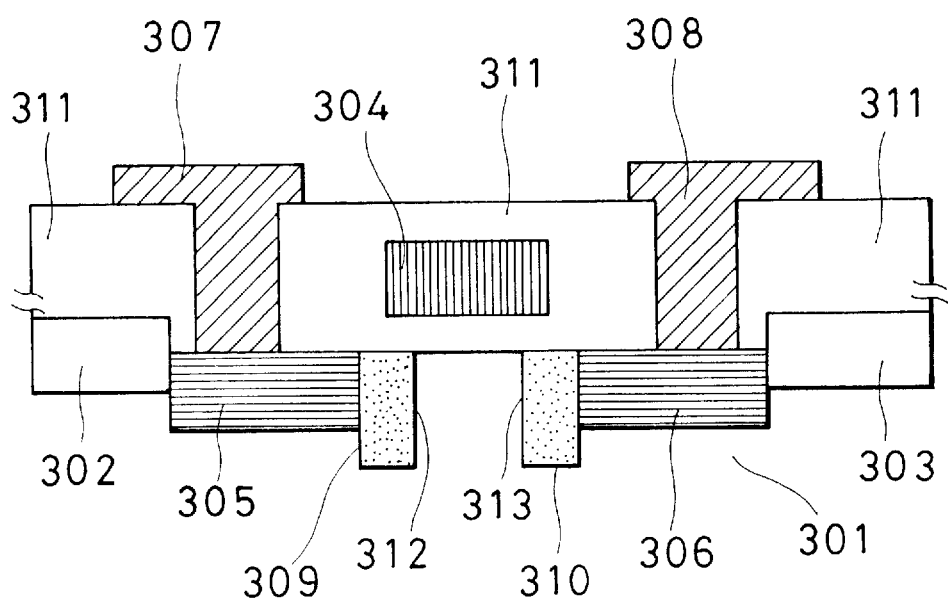
FIG. 17 Is a schematic cross sectional view showing a semiconductor device according to the present invention.
Figure 18:
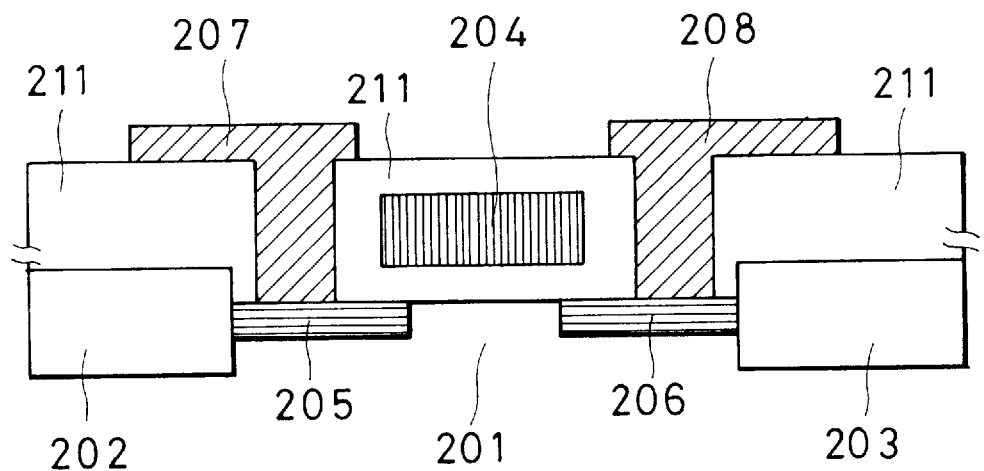
FIG. 18 is a schematic cross sectional view showing a semiconductor device according to the present invention.
Figure 19:
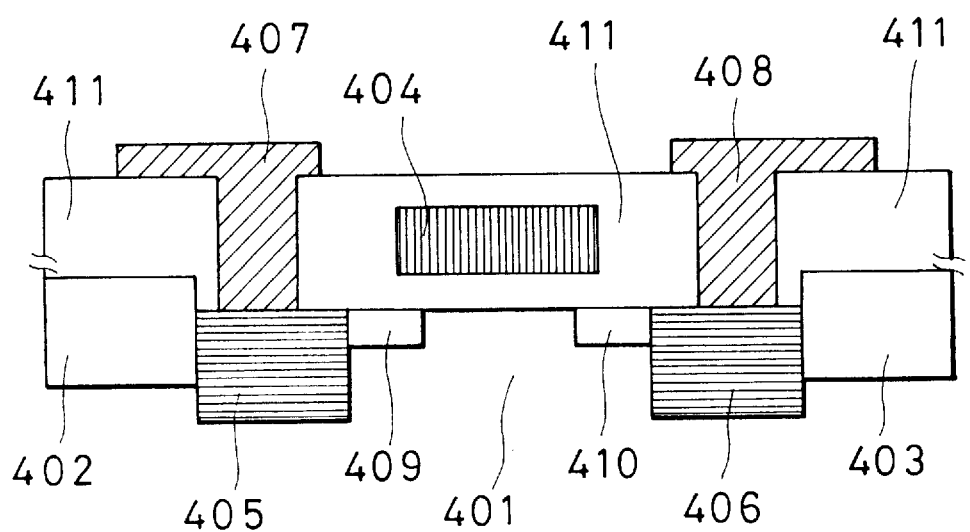
FIG. 19 is a schematic cross sectional view showing a semiconductor device according to the present invention.
Figure 20:
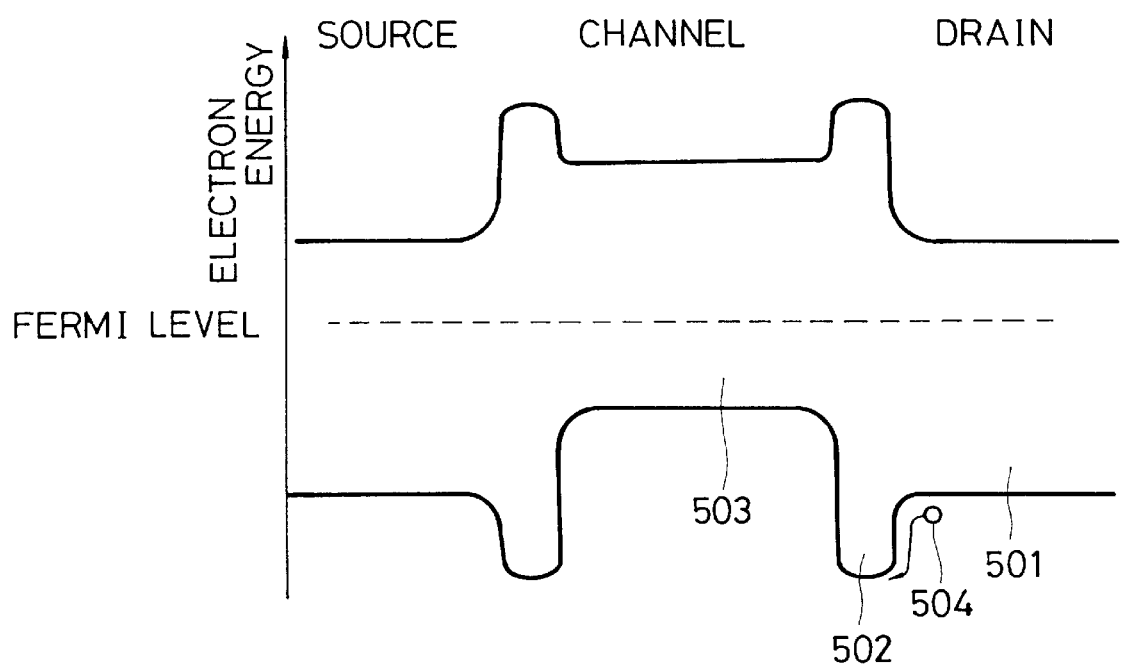
FIG. 20 is a schematic representation of an energy band for the structure according to the present invention.

The composition or the present invention is applicable to a planar type insulated gate field effect transistor shown in FIG. 16. In this case, the affect of the present invention can be obtained by providing between the channel and the source or drain regions a thin film of carbide, nitride, or oxide having a thickness of 10 to 500 Å, or as thin and uniform as possible. That is, only a step of providing the above thin film of carbide, nitride, or oxide or the combination thereof is incorporated into the fabrication process of a conventional planar type insulated gate FET.

Figure 26:
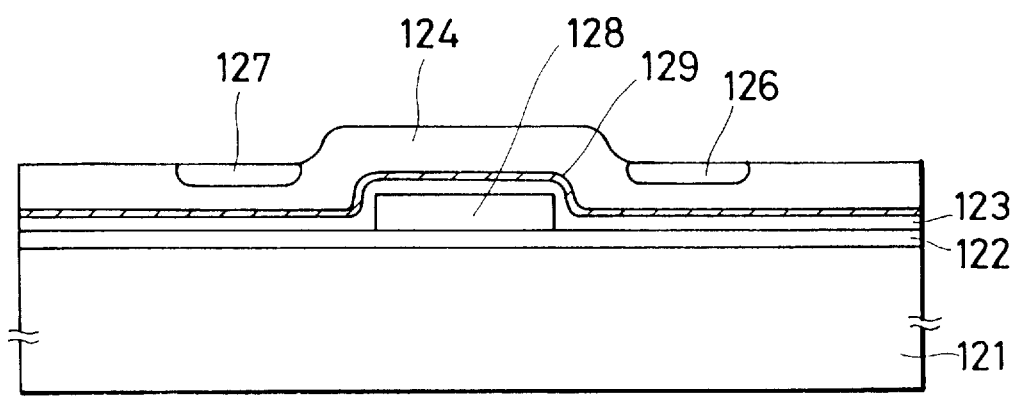
FIG. 26 is a schematic cross sectional view showing a semiconductor device according to the present invention.

In an inverted stagger type insulated gate FET as shown in FIG. 26, the problem of voltage resistance between the source and the drain, as well as the problem of reverse current leakage can be solved by providing a thin film of carbon, a carbide, a nitride, or an oxide at a thickness in the range of from 25 to 1,000 Å. Furthermore, by fabricating the device In this structure, it is possible to avoid the formation of a so-called back channel. As a result, this solves the problem in an n-channel insulated gate PET, for example, of the drain current leakage which occur at a voltage below the threshold value due to the development of, upon application of a negative voltage to the gate, a channel (back channel) at, as viewed from the gate electrode, the region opposite to the region at which the channel is supposed to form.

In the example related to the application of the present invention, as illustrated in FIGS. 15, 16, and 26, the device comprises a glass substrate 121, a silicon oxide undercoat film 122, a silicon oxide gate oxide film 123, a non-single crystal silicon semiconductor film 124, a region having added therein at least one or carbon, nitrogen, and oxygen 125, a drain 126, a source 127, a gate electrode 128, and a thin film 129 comprising at least one selected from carbon, nitrogen, and oxygen, or a thin film having added therein at least one selected therefrom. The thin film 129 was deposited by plasma assisted CVD, but other methods such as LPCVD, sputtering, and photochemical vapor deposition, may be used as well.

Furthermore, the EXAMPLES above referred specifically to silicon as the semiconductor, but there may be naturally employed other semiconductors, such as single crystal germanium, gallium arsenide, and other compound semiconductors.

The present invention provides a semiconductor device comprising a region having added therein carbon, nitrogen, or oxygen, which has thereby overcome the problems of reverse leakage between the source and the drain, and of throw leakage which occurs at a voltage well below the threshold value ascribed to the low voltage resistance between the source and the drain.

In accordance with the present invention, the region having added thereto an impurity such as carbon, nitrogen, and oxygen is provided between the channel forming region and a source or drain region, whereby the problem of throw leakage can be removed, which problem is caused under a condition or the voltage not higher than the threshold voltage, resulting from the low voltage resistance between the source and the drain. It is needless to say that single crystal germanium, GaAs, and other compound semiconductor may be used as the semiconductor substrate, in place of the single crystal silicon used in the above embodiments. Also, it is possible to utilize the heat diffusion method and the like for diffusing impurities in place of the ion implantation.

Since the present invention relates to a basic structure of a field effect transistor or a semiconductor integrated circuit, it is possible to combine the present invention with a TFT, and further to combine the PET in accordance with the present invention with a capacitor of planar type, stacked type, or trench type to thereby fabricate a DRAM.

The foregoing description of preferred embodiments has been presented for purposes of illustration and description. It is not intended to be exhaustive or to limit the invention to the precise form described, and obviously many modifications and variations are possible in light of the above teaching. The embodiments were chosen in order to explain most clearly the principles of the invention and its practical application thereby to enable others in the art to utilize most effectively the invention In various embodiments and with various modifications as are suited to the particular use contemplated.

What is claimed is:

1. An insulated gate field effect semiconductor device comprising:

a semiconductor layer including a channel region;

semiconductor source and drain regions provided in said semiconductor layer with said channel region therebetween;

a gate electrode provided adjacent to said channel region; and a gate insulating layer interposed between said gate electrode and said channel region;

a groove provided in a surface portion of said semiconductor layer which extends below the interface between the gate insulating layer and the gate electrode; and a region doped with one or more elements selected from the group consisting of carbon, nitrogen, and oxygen at a concentration of at least $1 \times 10^{19}$ atoms $cm^{-3}$, and provided in said semiconductor layer adjacent said groove in the vicinity of a boundary region between said channel region and one of said source region and said drain region.

2. The device of claim 1 wherein depth of said groove is 10 nm to 500 nm from a surface of said semiconductor layer.

3. The device of claim 1 wherein said groove is located outside of said gate electrode.

4. The device of claim 1 wherein said boundary region is doped at a doping concentration higher than any doping concentration of the same one or more elements in the remainder of said channel region.

5. An electro-optical device including an insulated gate field effect semiconductor device for driving a pixel of the electro-optical device comprising:

an electro-optical device including a plurality of pixels; and insulated gate field effect devices for respectively driving said pixels, said insulated gate field effect devices each including;

a semiconductor layer including a channel region;

semiconductor source and drain regions provided in contact with said channel region at a source-channel boundary and a drain-channel boundary respectively;

a gate electrode provided adjacent to said channel region; and a gate insulating layer interposed between said gate electrode and said channel region, wherein said semiconductor layer is doped with one or more elements selected from the group consisting of carbon, nitrogen, and oxygen in at least one boundary region in the vicinity of at least one of said source-channel boundary and said drain-channel boundary at a concentration of at least $1 \times 10^{19}$ atoms $cm^{-3}$.

6. An electro-optical device including an insulated gate field effect semiconductor device for driving a pixel of the electro-optical device comprising:

an electro-optical device including a plurality of pixels; and insulated gate field effect devices for respectively driving said pixels, said insulated gate field effect devices each including;

source and drain semiconductor regions and a channel semiconductor region in contact with said source and drain regions; and a gate electrode formed adjacent to said channel region with a gate insulating layer therebetween;

wherein a boundary region between said channel region and at least one of said source and drain regions has a higher energy band gap than any of said source, drain and channel regions.

7. An electro-optical device including an insulated gate field effect semiconductor device for driving a pixel of the electro-optical device comprising:

an electro-optical device including a plurality of pixels; and insulated gate field effect devices for respectively driving said pixels, said insulated gate field effect devices each including;

a semiconductor layer including a channel region;

semiconductor source and drain regions provided in contact with said channel region at a source-channel boundary and a drain-channel boundary respectively;

a gate electrode provided adjacent to said channel region; and a gate insulating layer interposed between said gate electrode and said channel region;

wherein by said semiconductor layer is doped with carbon in at least one boundary region in the vicinity of at least one of said source-channel boundary and said drain-channel boundary at a concentration of at least $1 \times 10^{19}$ atoms/cm$^3$.

8. An electro-optical device including an insulated gate field effect semiconductor device for driving a pixel of the electro-optical device comprising:

an electro-optical device including a plurality of pixels; and insulated gate field effect devices for respectively driving said pixels, said insulated gate field effect devices each including;

a semiconductor layer including a channel region;

semiconductor source and drain regions provided in contact with said channel region at a source-channel boundary and a drain-channel boundary respectively;

a gate electrode provided adjacent to said channel region; and a gate insulating layer interposed between said gate electrode and said channel region;

wherein said semiconductor layer is doped with nitrogen in at least one boundary region in the vicinity of at least one of said source-channel boundary and said drain-channel boundary at a concentration of at least $1 \times 10^{19}$ atoms/cm$^3$.

9. An electro-optical device including an insulated gate field effect semiconductor device for driving a pixel of the electro-optical device comprising:

an electro-optical device including a plurality of pixels; and insulated gate field effect devices for respectively driving said pixels, said insulated gate field effect devices each including;

a semiconductor layer including a channel region;

semiconductor source and drain regions provided in contact with said channel region at a source-channel boundary and a drain-channel boundary respectively;

a gate electrode provided adjacent to said channel region; and a gate insulating layer interposed between sand gate electrode and said channel region;

wherein said semiconductor layer is doped with oxygen in at least one boundary region in the vicinity of at least one of said source-channel boundary and said drain-channel boundary at a concentration of at least $1 \times 10^{19}$ atoms/cm$^3$.

* * * * *